(12) United States Patent
Mishra et al.

(10) Patent No.: US 12,270,886 B2
(45) Date of Patent: *Apr. 8, 2025

(54) METHODS AND APPARATUS TO TRIGGER CALIBRATION OF A SENSOR NODE USING MACHINE LEARNING

(71) Applicant: Intel Corporation, Santa Clara, CA (US)

(72) Inventors: Yatish Mishra, Tempe, AZ (US); Mats Agerstam, Portland, OR (US); Mateo Guzman, Hillsboro, OR (US); Sindhu Pandian, Hillsboro, OR (US); Shubhangi Rajasekhar, Santa Clara, CA (US); Pranav Sanghadia, Chandler, AZ (US); Troy Willes, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 61 days.

This patent is subject to a terminal disclaimer.

(21) Appl. No.: 18/309,366

(22) Filed: Apr. 28, 2023

(65) Prior Publication Data

US 2023/0266419 A1    Aug. 24, 2023

Related U.S. Application Data

(63) Continuation of application No. 17/521,622, filed on Nov. 8, 2021, now Pat. No. 11,686,803, which is a
(Continued)

(51) Int. Cl.
*H04W 4/50*    (2018.01)
*G01R 35/00*    (2006.01)
(Continued)

(52) U.S. Cl.
CPC ..... *G01R 35/005* (2013.01); *G06F 16/90335* (2019.01); *G06F 18/214* (2023.01);
(Continued)

(58) Field of Classification Search
CPC ............. G01R 35/005; G06F 16/90335; G06F 18/214; G06F 18/24143; G06N 3/04;
(Continued)

(56) References Cited

U.S. PATENT DOCUMENTS 9,767,671 B2    9/2017    Chattopadhyay
11,169,239 B2    11/2021    Mishra et al.
(Continued)

OTHER PUBLICATIONS

United States Patent and Trademark Office, "Non-Final Office Action," issued in connection with U.S. Appl. No. 16/146,893, filed Oct. 22, 2020, 25 Pages.
(Continued)

*Primary Examiner* — Michael J Dalbo
*Assistant Examiner* — Denise R Karavias
(74) *Attorney, Agent, or Firm* — Hanley, Flight & Zimmerman, LLC

(57) ABSTRACT

Methods, apparatus, systems and articles of manufacture to trigger calibration of a sensor node using machine learning are disclosed. An example apparatus includes a machine learning model trainer to train a machine learning model using first sensor data collected from a sensor node. A disturbance forecaster is to, using the machine learning model and second sensor data, forecast a temporal disturbance to a communication of the sensor node. A communications processor is to transmit a first calibration trigger in response to a determination that a start of the temporal disturbance is forecasted and a determination that a first calibration trigger has not been sent.

20 Claims, 11 Drawing Sheets

Related U.S. Application Data continuation of application No. 16/146,893, filed on Sep. 28, 2018, now Pat. No. 11,169,239.

(51) Int. Cl.

| | |
|---|---|
| *G06F 16/903* | (2019.01) |
| *G06F 18/214* | (2023.01) |
| *G06F 18/2413* | (2023.01) |
| *G06N 3/04* | (2023.01) |
| *G06N 3/08* | (2023.01) |
| *G06N 20/00* | (2019.01) |
| *G06Q 10/04* | (2023.01) |
| *G06V 10/764* | (2022.01) |
| *H04L 67/125* | (2022.01) |
| *H04W 4/70* | (2018.01) |
| *H04W 52/22* | (2009.01) |
| *H04L 67/12* | (2022.01) |

(52) U.S. Cl.
CPC ......... *G06F 18/24143* (2023.01); *G06N 3/04* (2013.01); *G06N 3/08* (2013.01); *G06N 20/00* (2019.01); *G06Q 10/04* (2013.01); *G06V 10/764* (2022.01); *H04L 67/125* (2013.01); *H04W 4/50* (2018.02); *H04W 4/70* (2018.02); *H04W 52/223* (2013.01); *H04L 67/12* (2013.01)

(58) Field of Classification Search
CPC .......... G06N 3/08; G06N 20/00; G06Q 10/04; G06V 10/764; H04L 67/125; H04L 67/12; H04W 4/50; H04W 4/70; H04W 52/223

See application file for complete search history.

(56) References Cited

U.S. PATENT DOCUMENTS

| | | | |
|---|---|---|---|
| 11,686,803 B2 * | 6/2023 | Mishra | G01R 35/005 |
| | | | 702/104 |
| 2014/0046612 A1 | 2/2014 | Andelic et al. | |
| 2014/0178084 A1 | 6/2014 | Kuo et al. | |
| 2016/0125720 A1 * | 5/2016 | Chattopadhyay | G08B 21/187 |
| | | | 340/514 |
| 2016/0196375 A1 | 7/2016 | Nasle | |
| 2016/0266081 A1 * | 9/2016 | Risk | G01N 21/3504 |
| 2016/0291552 A1 * | 10/2016 | Pal | G05B 13/026 |
| 2017/0372601 A1 | 12/2017 | Yamashita et al. | |
| 2018/0332483 A1 * | 11/2018 | Yoon | H04L 5/006 |

OTHER PUBLICATIONS

United States Patent and Trademark Office, "Final Office Action", issued in connection with U.S. Appl. No. 16/146,893, filed Apr. 9, 2021, 25 pages.

United States Patent and Trademark Office, "Notice of Allowance and Fee(s) Due," issued in connection with U.S. Appl. No. 16/146,893, filed Jul. 2, 2021, 11 pages.

United States Patent and Trademark Office, "Notice of Allowance and Fee(s) Due," issued in connection with U.S. Appl. No. 17/521,622, filed Feb. 7, 2023, 13 pages.

United States Patent and Trademark Office, "Corrected Notice of Allowability," issued in connection with U.S. Appl. No. 17/521,622, filed Feb. 15, 2023, 10 pages.

* cited by examiner

METHODS AND APPARATUS TO TRIGGER CALIBRATION OF A SENSOR NODE USING MACHINE LEARNING

RELATED APPLICATION

This patent arises from a continuation of U.S. patent application Ser. No. 17/521,622 (now U.S. Pat. No. 11,686,803), which was filed on Nov. 8, 2021, which is a continuation of U.S. patent application Ser. No. 16/146,893, (now U.S. Pat. No. 11,169,239) which was filed on Sep. 28, 2018. U.S. patent application Ser. No. 17/521,622 and U.S. patent application Ser. No. 16/146,893 are hereby incorporated herein by reference in their entireties. Priority to U.S. patent application Ser. No. 17/521,622 and U.S. patent application Ser. No. 16/146,893 is hereby claimed.

FIELD OF THE DISCLOSURE

This disclosure relates generally to collection of sensor data, and, more particularly, to methods and apparatus to trigger calibration of a sensor node using machine learning.

BACKGROUND

In recent years, wireless sensor networks have been deployed in industrial settings to collect operational statistics of manufacturing facilities. Such wireless sensor networks are preferred over wired sensor networks, as the cost of installing such wired sensors is high, due to conduits, power cabling, data cabling, etc. that are to be installed.

BRIEF DESCRIPTION OF THE DRAWINGS

The figures are not to scale. In general, the same reference numbers will be used throughout the drawing(s) and accompanying written description to refer to the same or like parts.

DETAILED DESCRIPTION

Figure 1:
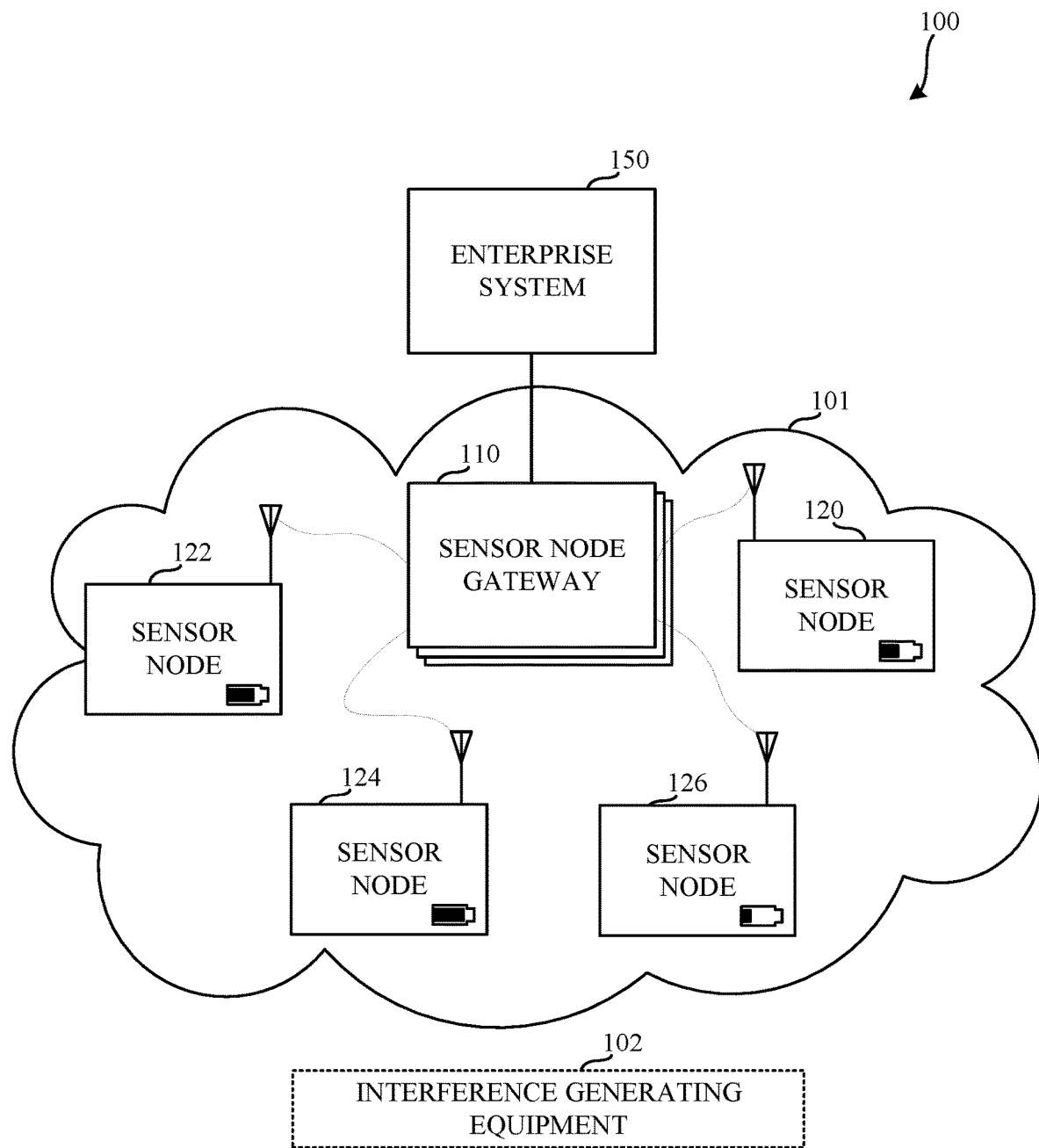
FIG. 1 is a block diagram of an example computing system constructed in accordance with teachings of this disclosure and including a sensor node gateway, sensor nodes, and interference generating equipment.

There is an increasing demand for wireless sensor networks (WSN) in industrial deployments. Such demand is, for example, due to rising costs of running power cabling, data cabling, and associated conduits in manufacturing facilities to enable the use of traditional wired sensors. To implement the WSN, sensor nodes are placed throughout a facility, and report data to one or more sensor node gateways. However, the sensor nodes are typically battery operated devices and, as a result, present a challenge with respect to power consumption and/or battery life. Such sensor nodes are expected to sustain multi-year operational runtime.

In manufacturing facilities, different operations/processes are started at different times (e.g., based on a layout of the production site, a schedule at which manufacturing operations are conducted, etc.) Manufacturing equipment commonly emits radiant noise (e.g., electromagnetic interference (EMI)) in the operational spectrum of the WSN and, as a result, can cause interference when the sensor node(s) attempt to communicate data. This EMI can manifest itself as interference to the different nodes of the WSN in both spatial and temporal terms. For example, when interference generating equipment (e.g., a machine) is operated, EMI at a first sensor node (at a first location) may manifest itself differently from the EMI at a second sensor node (at a second location different from the first location). Moreover, the interference may vary in intensity over time depending on which equipment of the manufacturing floor is active. Such variations are known to cause high fluctuations in interference between communicating nodes.

Existing WSN systems utilize a fixed configuration after deployment where parameters such as a data reporting interval (e.g., how frequently a sensor node is to attempt to transmit data), communications settings (e.g., transmit strengths, number of frames to send, where to transmit the frames, etc.) are statically configured at the sensor node. The static nature of such systems makes improvement of battery life while maintaining a required level of quality of service (QoS) difficult. To maintain a required QoS, sensor nodes are commonly configured to account for data transmissions that occur during periods of communications disturbances (e.g., the sensor nodes must be able to communicate in the worst expected operational conditions). To overcome those disturbances, sensor nodes are configured to use large amounts of transmit power and many re-transmitted frames. As a result, in periods where there are no communications disturbances, sensor nodes consume more power than necessary to maintain the QoS. Manual re-calibration of the deployment is difficult as the variations are not only spatial due to the physical location of the nodes, but also temporal in that interference sources may vary over time. As a result, typical fixed/default configurations result in high-power repeated transmissions on the part of the sensor node(s), resulting in higher power consumption and shorter battery life than utilizing the example approaches disclosed herein.

Example approaches disclosed herein utilize machine learning to increase the reliability of communications of a WSN, as well as improve battery life of sensor nodes within the WSN. To accomplish such increases and/or improvements, example approaches disclosed herein utilize machine learning to determine when to trigger calibration of sensor nodes within the WSN.

FIG. 1 is a block diagram of an example computing system 100 constructed in accordance with teachings of this disclosure and including a wireless sensor network 101 and interference-generating equipment 102. The example wireless sensor network 101 includes a sensor node gateway 110 and sensor nodes 120, 122, 124, 126. In the illustrated example of FIG. 1, the example sensor node gateway 110 communicates sensor data to an enterprise system 150.

The interference generating equipment 102 in the illustrated example of FIG. 1 is any sort of machine, equipment, device, etc. that generates interference. In the illustrated example of FIG. 1, the interference generated by the interference generating equipment 102 affects the communications within the wireless sensor network 101. Such effects may be temporal and/or spatial. For example, the effects may be temporal in that the interference is primarily generated while the interference generating equipment 102 is being operated. The effects may be spatial in that the interference is stronger when in close proximity to the interference generating equipment 102. Thus, a first sensor node operated in close proximity to the interference generating equipment 102 may experience more interference while the interference generating equipment 102 is in operation than a second sensor node that is further away from the interference generating equipment 102.

The sensor node gateway 110 of the illustrated example of FIG. 1 enables data collected by the sensor nodes 120, 122, 124, 126 to be transmitted and/or otherwise relayed to the enterprise system 150. In some examples, multiple sensor node gateways may be used to, for example, enable sensor nodes to be spaced relatively far apart from each other. For example, multiple sensor node gateways may be installed in a large manufacturing facility to facilitate receipt of data from sensor nodes also installed throughout the facility. However, the sensor node gateway 110 may be implemented in any other location such as, for example, in a building, at a roadside, in a commercial space, etc. An example implementation of the sensor node gateway 110 is described below in connection with FIG. 3.

The sensor nodes 120, 122, 124, 126 of the illustrated example of FIG. 1 collect sensor data and report the sensor data to the sensor node gateway 110. In examples disclosed herein, the sensor data represents temperature data. However, any other type of sensor data may additionally or alternatively be used such as, for example, image data, audio data, pressure sensor readings, etc. In the illustrated example of FIG. 1, the sensor node(s) are statically placed such that they provide sensor data corresponding to various locations in, for example, a manufacturing environment. In some examples, the sensor nodes are in fixed locations and are not hard-wired. As a result, the sensor nodes operate on battery power. Moreover, such fixed locations may not be easy to access for battery replacement purposes. Thus, ensuring that the sensor nodes operate in as power-efficiently a manner as possible is important for reducing the number of times that the sensor node is to have its battery changed. In some examples, the sensor node may be mobile (e.g., attached to a robot that moves about the manufacturing environment). An example implementation of the example sensor node 120 is described below in connection with FIG. 4.

The example enterprise system 150 is a system that enables the sensor data collected by the sensor node(s) 120, 122, 124, 126 to be reviewed by an enterprise administrator. In examples disclosed herein, the example enterprise system 150 is implemented by one or more computer systems (e.g., servers). Such computer systems may be local to the sensor node gateway(s) and/or may be implemented remotely from the sensor node gateway(s) (e.g., in a cloud computing environment). In some examples, the enterprise system 150 coordinates the operation of the interference generating equipment 102 through an enterprise scheduling system. In some examples, planning information from the scheduling system is provided to the sensor node gateway 110 to facilitate prediction of temporal disturbances.

Figure 2:
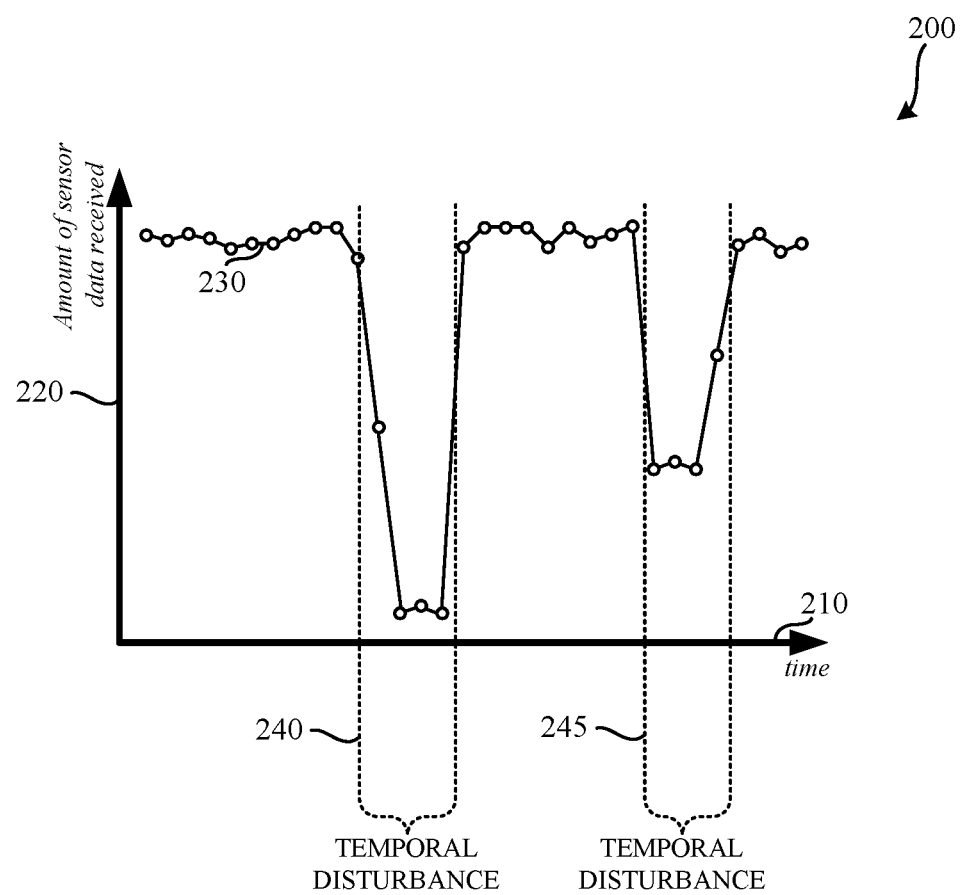
FIG. 2 is a diagram illustrating temporal periods of disturbance caused by the interference-generating equipment.

FIG. 2 is a diagram 200 illustrating temporal periods of disturbance caused by the interference-generating equipment. The diagram 200 of FIG. 2 includes a horizontal axis 210 representing time, and a vertical axis 220 representing an amount of sensor data received at the sensor node gateway 110. In the illustrated example of FIG. 2, the horizontal axis 210 represents three days. However, any other time-frame may additionally or alternatively be represented. While, in the illustrated example of FIG. 2, the vertical axis 220 represents an amount of data received, any other measure of the quality of data transmissions between the sensor node(s) 120, 122, 124, 126 and the sensor node gateway 110 may additionally or alternatively be used. For example, the vertical axis 220 may represent a Received Signal Strength Indication (RSSI). Data points 230 represent the amount of sensor data received at the sensor node gateway 110 over time.

The example diagram 200 of FIG. 2 includes a first period of temporal disturbance 240 and a second period of temporal disturbance 245. Outside of the first and second periods of temporal disturbance 240, 245, the amount of sensor data 230 indicates a normal amount of received data. Within the first and second periods of temporal disturbance 240, 245, the sensor data 230 indicates that interference during those time periods has caused reduced amounts of data to be received.

In examples disclosed herein, each sensor node in the WSN 101 will have normal fluctuations of RSSI due to diffractions (e.g., slow fading) and reflections/multi-path (e.g., fast fading). The statistical distribution of those diffractions and reflections are generally Gaussian and Rayleigh respectively. For slow fading, the standard deviation is based on the physical placement of nodes and can vary, but normally falls in the range of 1.5 dBm to 12 dBm (e.g., depending on level(s) of diffractions between the nodes). The temporal fluctuations can be on the order of 20 dBm due to the emitted interference from the interference generating equipment 102 and can last for hours before returning to the normal range.

Figure 3:
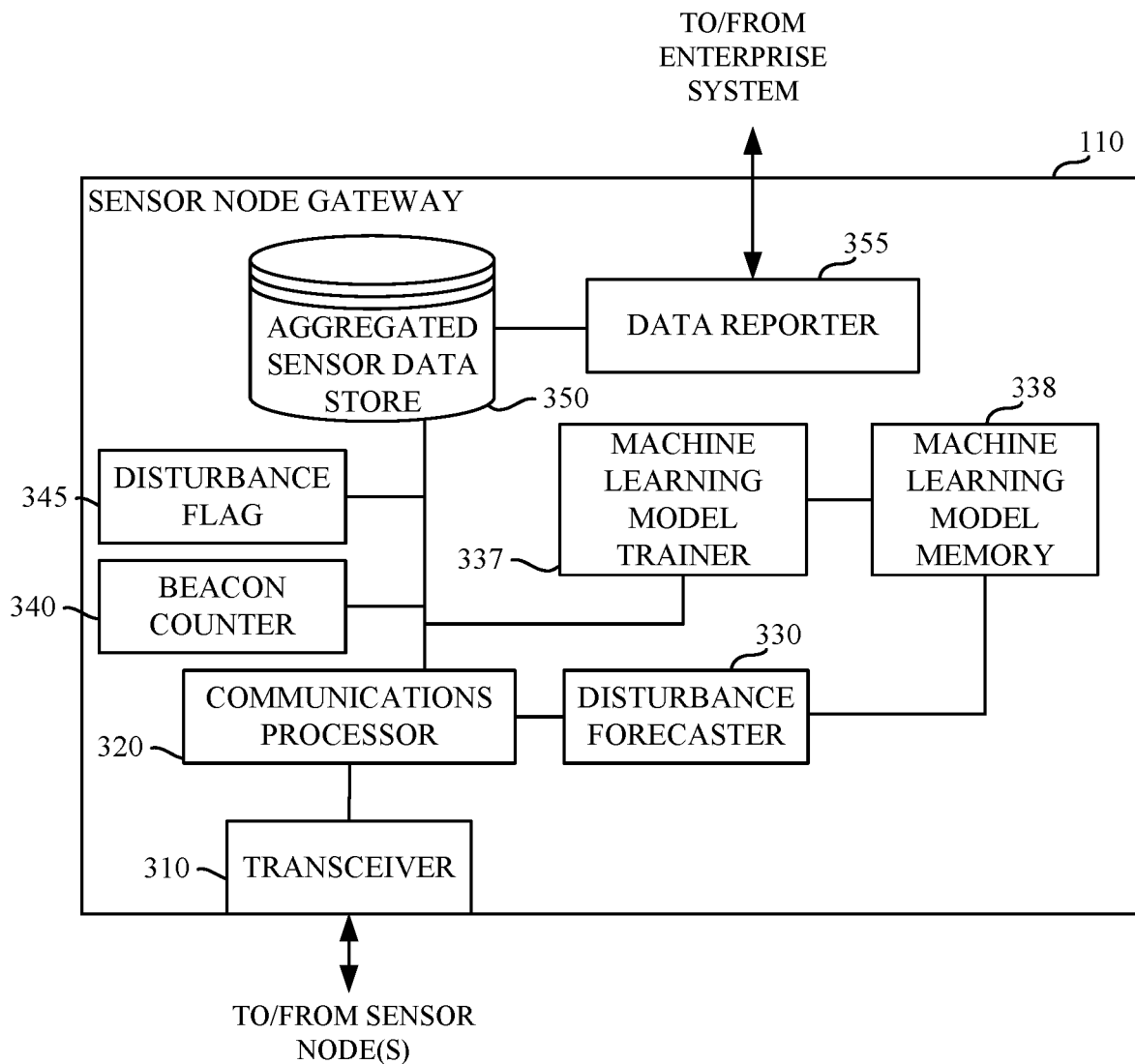
FIG. 3 is a block diagram of an example implementation of the example sensor node gateway of FIG. 1.

FIG. 3 is a block diagram of an example implementation of the example sensor node gateway 110 of FIG. 1. The example sensor node gateway 110 of the illustrated example of FIG. 3 includes a transceiver 310, a communications processor 320, a disturbance forecaster 330, a machine learning model trainer 337, a machine learning model memory 338, a beacon counter 340, a disturbance flag 345, an aggregated sensor data store 350, and a data reporter 355.

The example transceiver 310 of the illustrated example of FIG. 3 is implemented by a wireless transceiver capable of wirelessly communicating a data to and/or from the sensor node(s). In examples disclosed herein, the transceiver 310 communicates using a Bluetooth Low Energy (BLE) communications protocol. In examples disclosed herein, the transceiver 310 communicates using a connectionless protocol. However, any other past, present, and/or future communications protocols/technologies may additionally or alternatively be used such as, for, an International Society of Automation (ISA) 100.11a standard, a Highway Addressable Remote Transducer Protocol (HART) protocol, a WirelessHART protocol, an Institute of Electrical and Electronics Engineers (IEEE) 802.15.4 standard, etc.

The example communications processor 320 of the illustrated example of FIG. 3 is implemented by a logic circuit such as, for example, a hardware processor. However, any other type of circuitry may additionally or alternatively be used such as, for example, one or more analog or digital circuit(s), logic circuits, programmable processor(s), Application Specific Integrated Circuit(s) (ASIC(s)), programmable logic device(s) (PLD(s)) and/or field programmable logic device(s) (FPLD(s)), programmable controller(s), graphics processing unit(s) (GPU(s)), digital signal processor(s) (DSP(s)), etc.

The example communications processor 320 enables the sensor node gateway 110 to process received communications from the sensor node(s). When receiving communications from the sensor node(s), the example communications processor 320 may determine whether, for example, the communications is a reset frame count instruction, a beacon frame, a frame count request, and/or includes sensor data. In response to the determination, the example communications processor 320 may record information at the sensor node gateway (e.g., reset a counter, increment a counter, store sensor data) and/or may reply to the sensor node with information (e.g., a value of the counter).

The example disturbance forecaster 330 of the illustrated example of FIG. 3 is implemented by a logic circuit such as, for example, a hardware processor. However, any other type of circuitry may additionally or alternatively be used such as, for example, one or more analog or digital circuit(s), logic circuits, programmable processor(s), ASIC(s), PLD(s), FPLD(s), programmable controller(s), GPU(s), DSP(s), etc. The example disturbance forecaster 330 implements a machine learning model (e.g., a neural network) according to the model information stored in the machine learning model memory 338. The example machine learning model of the illustrated example of FIG. 3 is a deep neural network (DNN). However, any other past, present, and/or future machine learning topology(ies) and/or architecture(s) may additionally or alternatively be used such as, for example, a convolutional neural network (CNN), a feed-forward neural network. Using the model stored in the machine learning model memory 338, the example disturbance forecaster 330 determines whether a temporal disturbance (e.g., communications interference) is forecasted.

If the example disturbance forecaster 330 determines that the temporal disturbance is forecasted, the example disturbance forecaster 330 determines whether the example disturbance flag 345 is set to zero. If the temporal disturbance flag is set to zero, this indicates that the wireless sensor network has just entered the temporal disturbance period, and that calibration of the sensor nodes should be triggered. That is, if the example disturbance forecaster 330 determines that the disturbance flag 345 is set to zero, the example disturbance forecaster 330 sets the temporal disturbance flag to one and transmits, via the transceiver 310, a calibration trigger. If the example disturbance forecaster 330 determines that the disturbance flag 345 is set to one, no calibration trigger is sent.

If the example disturbance forecaster 330 determines that the temporal disturbance is not forecasted (indicating that the wireless sensor network is not operating in a period of temporal disturbance), the example disturbance forecaster 330 determines whether the example disturbance flag 345 is set to one. If the temporal disturbance flag is set to one, this indicates that the wireless sensor network has just left the temporal disturbance period, and that calibration of the sensor nodes should be triggered. That is, if the example disturbance forecaster 330 determines that the disturbance flag 345 is set to one, the example disturbance forecaster 330 sets the temporal disturbance flag to zero and transmits, via the transceiver 310, the calibration trigger. If the example disturbance forecaster 330 determines that the disturbance flag 345 is set to zero (indicating that the calibration trigger for the period of non-disturbance has already been transmitted), no calibration trigger is transmitted.

The machine learning model trainer 337 of the illustrated example of FIG. 3 is implemented by a logic circuit such as, for example, a hardware processor. However, any other type of circuitry may additionally or alternatively be used such as, for example, one or more analog or digital circuit(s), logic circuits, programmable processor(s), ASIC(s), PLD(s), FPLD(s), programmable controller(s), GPU(s), DSP(s), etc. The example machine learning model trainer 337 performs training of the model stored in the machine learning model memory 338. In examples disclosed herein, training is performed using Stochastic Gradient Descent. However, any other approach to training a machine learning model may additionally or alternatively be used.

The example machine learning model memory 338 of the illustrated example of FIG. 3 is implemented by any memory, storage device and/or storage disc for storing data such as, for example, flash memory, magnetic media, optical media, etc. Furthermore, the data stored in the example machine learning model memory 338 may be in any data format such as, for example, binary data, comma delimited data, tab delimited data, structured query language (SQL) structures, etc. While in the illustrated example the example machine learning model memory 338 is illustrated as a single device, the example machine learning model memory 338 and/or any other data storage devices described herein may be implemented by any number and/or type(s) of memories. In the illustrated example of FIG. 3, the example machine learning model memory 338 stores a machine learning model that, based on input sensor data, enables prediction of a period of temporal disturbance.

The example beacon counter 340 of the illustrated example of FIG. 3 is implemented by any memory, storage device and/or storage disc for storing data such as, for example, flash memory, magnetic media, optical media, etc. The data stored in the example beacon counter 340 represents a number of beacon frames received from a given sensor node. In some examples, multiple different beacon counters 340 may exist to enable handling of multiple different sensor nodes. However, in some examples, a single beacon counter 340 (e.g., a single memory) may be used to handle multiple different sensor nodes. Furthermore, the data stored in the example beacon counter 340 may be in any data format such as, for example, binary data, comma delimited data, tab delimited data, structured query language (SQL) structures, etc. While in the illustrated example the example beacon counter 340 is illustrated as a single device, the example beacon counter 340 and/or any other data storage devices described herein may be implemented by any number and/or type(s) of memories.

The example disturbance flag 345 of the illustrated example of FIG. 3 is implemented by any memory, storage device and/or storage disc for storing data such as, for example, flash memory, magnetic media, optical media, etc. The data stored in the example disturbance flag 345 is a binary value indicating whether a calibration trigger has been sent when entering and/or exiting a period of temporal disturbance. However, the data stored in the example disturbance flag 345 may be in any data format such as, for example, binary data, comma delimited data, tab delimited data, structured query language (SQL) structures, etc. While in the illustrated example the example disturbance flag 345 is illustrated as a single device, the example disturbance flag 345 and/or any other data storage devices described herein may be implemented by any number and/or type(s) of memories.

The example aggregated sensor data store 350 of the illustrated example of FIG. 3 is implemented by any memory, storage device and/or storage disc for storing data such as, for example, flash memory, magnetic media, optical media, etc. Furthermore, the data stored in the example aggregated sensor data store 350 may be in any data format such as, for example, binary data, comma delimited data, tab delimited data, structured query language (SQL) structures, etc. While in the illustrated example the example aggregated sensor data store 350 is illustrated as a single device, the example aggregated sensor data store 350 and/or any other data storage devices described herein may be implemented by any number and/or type(s) of memories. In the illustrated example of FIG. 3, the example aggregated sensor data store 350 stores a sensor data received from the one or more sensors that report data to the example sensor node gateway.

The example data reporter 355 of the illustrated example of FIG. 3 is implemented by a logic circuit such as, for example, a hardware processor. However, any other type of circuitry may additionally or alternatively be used such as, for example, one or more analog or digital circuit(s), logic circuits, programmable processor(s), ASIC(s), PLD(s), FPLD(s), programmable controller(s), GPU(s), DSP(s), etc. The example data reporter 355 reports sensor data stored in the example aggregated sensor data store 350 to the example enterprise system 150.

Figure 4:
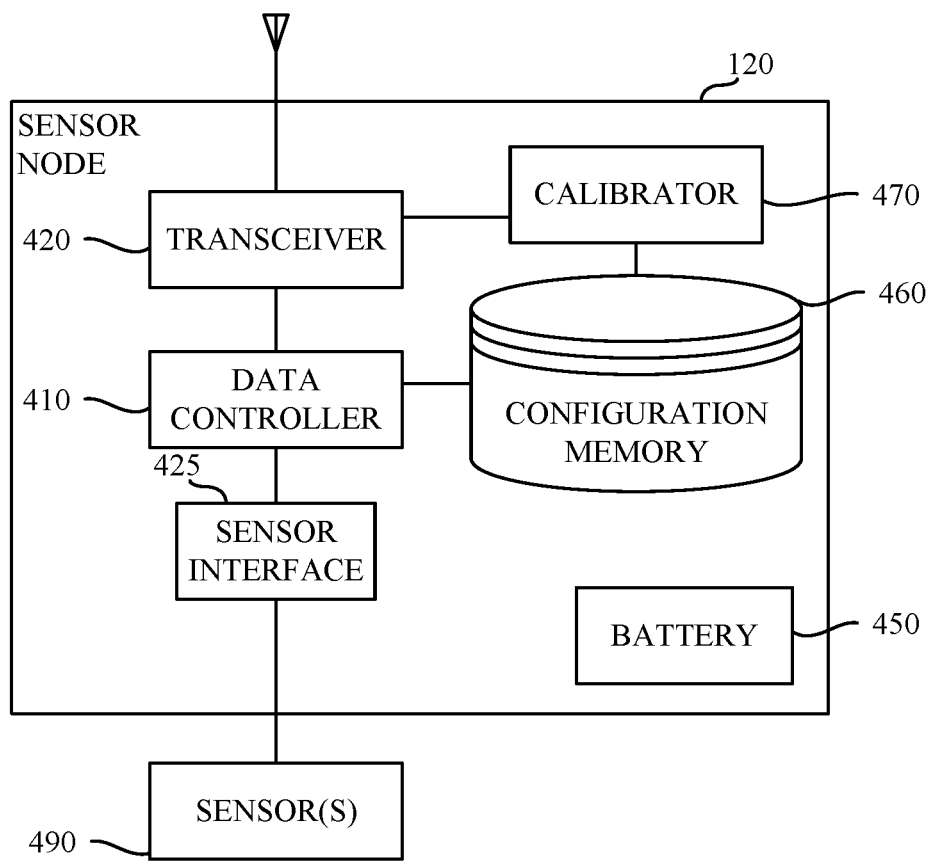
FIG. 4 is a block diagram of an example implementation of the example sensor node of FIG. 1.

FIG. 4 is a block diagram of an example implementation of the example sensor node 120 of FIG. 1. The example sensor node 120 of the illustrated example of FIG. 4 includes a data controller 410, a transceiver 420, a sensor interface 425, a battery 450, a configuration memory 460, and a calibrator 470. The example sensor node 120 of the illustrated example of FIG. 4 accesses data from one or more sensors 490. In some examples, the sensors 490 are implemented as a component of the sensor node 120. However, in some other examples, these one or more sensors 490 are implemented separately from the example sensor node 120, and the sensor node 120 interfaces with those sensor(s) to retrieve sensor data.

The example data controller 410 of the illustrated example of FIG. 4 is implemented by a logic circuit such as, for example, a hardware processor. However, any other type of circuitry may additionally or alternatively be used such as, for example, one or more analog or digital circuit(s), logic circuits, programmable processor(s), ASIC(s), PLD(s), FPLD(s), programmable controller(s), GPU(s), DSP(s), etc. The example data controller 410 determines whether the sensor node 120 should wake from a low power mode. In examples disclosed herein, the data controller 410 determines that the device should be woken from the low power mode periodically (e.g., every ten minutes, every hour, etc.) However, the example data controller 410 may determine that the sensor node should be woken from the low power mode in any other fashion. For example, the data controller 410 may determine that the device should be woken from the low power mode a-periodically (e.g., in response to an external stimulus such as an instruction to wake from the low power mode, a sensor value, etc.).

Upon waking from the low power mode and/or upon performing further communications monitoring, the example data controller 410 determines whether a calibration instruction has been received and, if so, causes the example calibrator 470 to perform calibration. The example data controller 410 causes the sensor interface 425 to retrieve sensor data from the one or more sensors 490. The example data controller 410 causes the sensor data to be relayed to the example sensor data gateway 110 via the transceiver 420.

The example transceiver 420 of the illustrated example of FIG. 4 enables the sensor node 120 to communicate sensor data to the sensor node gateway 110. In examples disclosed herein, the transceiver 420 communicates using a Bluetooth Low Energy (BLE) communications protocol. In examples disclosed herein, the transceiver 420 communicates using a connectionless protocol. However, any other past, present, and/or future communications protocols/technologies may additionally or alternatively be used such as, for, an International Society of Automation (ISA) 100.11a standard, a Highway Addressable Remote Transducer Protocol (HART) protocol, a WirelessHART protocol, an Institute of Electrical and Electronics Engineers (IEEE) 802.15.4 standard, etc.

The example sensor interface 425 of the illustrated example of FIG. 4 is implemented by an analog to digital converter. As a result, the example sensor interface 425 receives an analog sensor value from the one or more sensors 490 and converts the analog sensor value into a digital value for reporting to the sensor node gateway 110. However, the example sensor interface 425 may be implemented using any other circuitry such as, for example, one or more analog or digital circuit(s), logic circuits, programmable processor(s), ASIC(s), PLD(s), FPLD(s), programmable controller(s), GPU(s), DSP(s), etc.

The example battery 450 of the illustrated example of FIG. 4 is implemented using a rechargeable lithium-ion battery. However, any other type of battery and/or, more generally, any power source may additionally or alternatively be used. For example, the battery 450 may be implemented using a non-rechargeable battery. In some examples, the battery 450 is implemented using a separate power source such as, for example, a solar cell.

The example configuration memory 460 of the illustrated example of FIG. 4 is implemented by any memory, storage device and/or storage disc for storing data such as, for example, flash memory, magnetic media, optical media, etc. Furthermore, the data stored in the example configuration memory 460 may be in any data format such as, for example, binary data, comma delimited data, tab delimited data, structured query language (SQL) structures, etc. While in the illustrated example the example configuration memory 460 is illustrated as a single device, the example configuration memory 460 and/or any other data storage devices described herein may be implemented by any number and/or type(s) of memories. In the illustrated example of FIG. 4, the example configuration memory 460 stores configuration information specific to the sensor node including, for example, a transmission power to be used by the sensor node, a number of re-transmissions to be made, a gateway identifier, etc.

The example calibrator 470 the illustrated example of FIG. 4 is implemented by a logic circuit such as, for example, a hardware processor. However, any other type of circuitry may additionally or alternatively be used such as, for example, one or more analog or digital circuit(s), logic circuits, programmable processor(s), ASIC(s), PLD(s), FPLD(s), programmable controller(s), GPU(s), DSP(s), etc. The example calibrator 470, at the direction of the sensor node gateway 110, calibrates transmission settings of the sensor node 120.

To perform the calibration process, the example calibrator 470 identifies combinations of transmit power and numbers of frames to send. The example calibrator 470 configures the example transceiver 420 to transmit using the transmit power of the identified combination of transmit power and number of frames to send, and initializes the example transmit counter 412. The example calibrator 470 causes the example transceiver 420 to transmit a reset frame count signal to all nearby sensor node gateways 110. The example calibrator 470 then causes the transceiver 420 to send a number of beacon frames to all nearby sensor node gateways 110 using the configured transmit power. Upon completion of the transmission of the beacon frames, the example calibrator 470 accesses the number of beacon frames received at each of the nearby sensor node gateways. The process is repeated for a number of combinations of transmit powers and number of frames to send, and the resulting number of frames for each combination is stored at the sensor node.

The example calibrator 470 then calculates a reliability of transmitting to each responsive sensor node gateway using each of the combinations as well as the resulting number of frames received. The example calibrator 470 then selects a combination and sensor node gateway, and stores the selected combination and sensor node gateway in the configuration memory 460. As a result, the data controller 410, subsequently causes the sensor node to operate using the transmit power, number of frames to send, and the selected sensor node gateway based on the information stored by the calibrator 470 in the configuration memory 460.

The example sensors 490 of the illustrated example of FIG. 4 are device(s), module(s), or subsystem(s) that detect events and/or changes in their environment. In the illustrated example of FIG. 4, a single sensor is shown. However, any number of sensors may be used. Moreover, sensors may be of a same type and/or of different types. In examples disclosed herein, the sensors 490 are temperature sensors. However, any other type of sensors may additionally or alternatively be used such as, for example, image sensor(s), audio sensor(s), pressure sensor(s), etc. In the illustrated example of FIG. 4, the sensor(s) are shown separately from the sensor node 120. However, in some examples, the sensor(s) may be an internal component of the sensor node 120.

While an example manner of implementing the sensor node gateway 110 of FIG. 1 is illustrated in FIG. 3 and an example manner of implementing the sensor node 120 of FIG. 1 is illustrated in FIG. 4, one or more of the elements, processes and/or devices illustrated in FIGS. 1, 3, and/or 4 may be combined, divided, re-arranged, omitted, eliminated and/or implemented in any other way. Further, the example transceiver 310, the example communications processor 320, the example disturbance forecaster 330, the example machine learning model trainer 337, the example data reporter 355, and/or, more generally, the example sensor node gateway 110; and/or the example data controller 410, the example transceiver 420, the example sensor interface 425, the example calibrator 470 and/or, more generally, the example sensor node 120 of FIG. 4 may be implemented by hardware, software, firmware and/or any combination of hardware, software and/or firmware. Thus, for example, any of the example transceiver 310, the example communications processor 320, the example disturbance forecaster 330, the example machine learning model trainer 337, the example data reporter 355, and/or, more generally, the example sensor node gateway 110; and/or the example data controller 410, the example transceiver 420, the example sensor interface 425, the example calibrator 470 and/or, more generally, the example sensor node 120 of FIG. 4 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example transceiver 310, the example communications processor 320, the example disturbance forecaster 330, the example machine learning model trainer 337, the example data reporter 355, and/or, more generally, the example sensor node gateway 110; and/or the example data controller 410, the example transceiver 420, the example sensor interface 425, the example calibrator 470 and/or, more generally, the example sensor node 120 of FIG. 4 is/are hereby expressly defined to include a non-transitory computer readable storage device or storage disk such as a memory, a digital versatile disk (DVD), a compact disk (CD), a Blu-ray disk, etc. including the software and/or firmware. Further still, the example sensor node gateway 110 of FIGS. 1 and/or 3 and the example sensor node 120 of FIGS. 1 and/or 4 may include one or more elements, processes and/or devices in addition to, or instead of, those illustrated in FIGS. 1, 3, and/or 4, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 5:
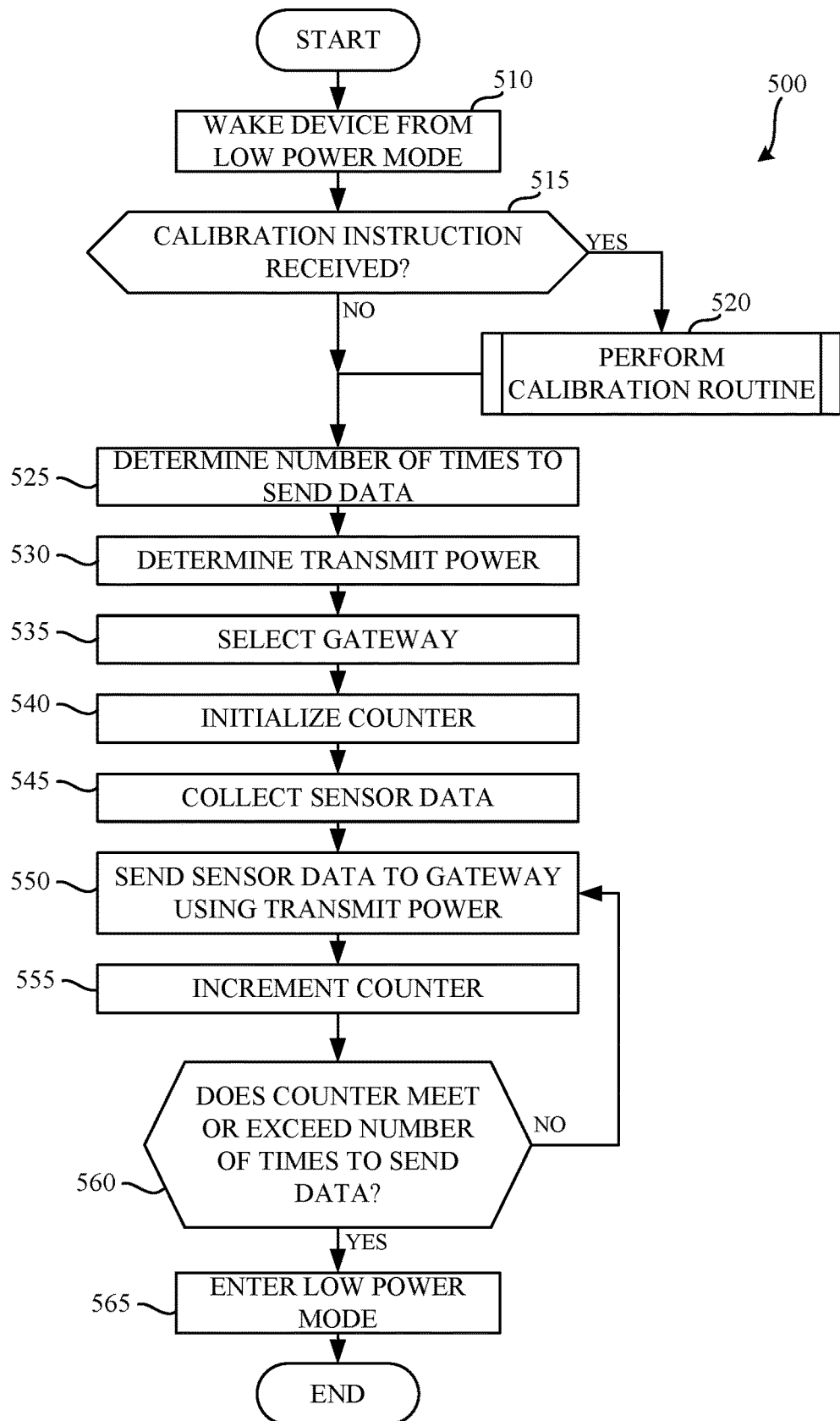
FIG. 5 is a flowchart representative of machine readable instructions which may be executed to implement the example sensor node of FIGS. 1 and/or 4 to collect and report sensor data.
Figure 6:
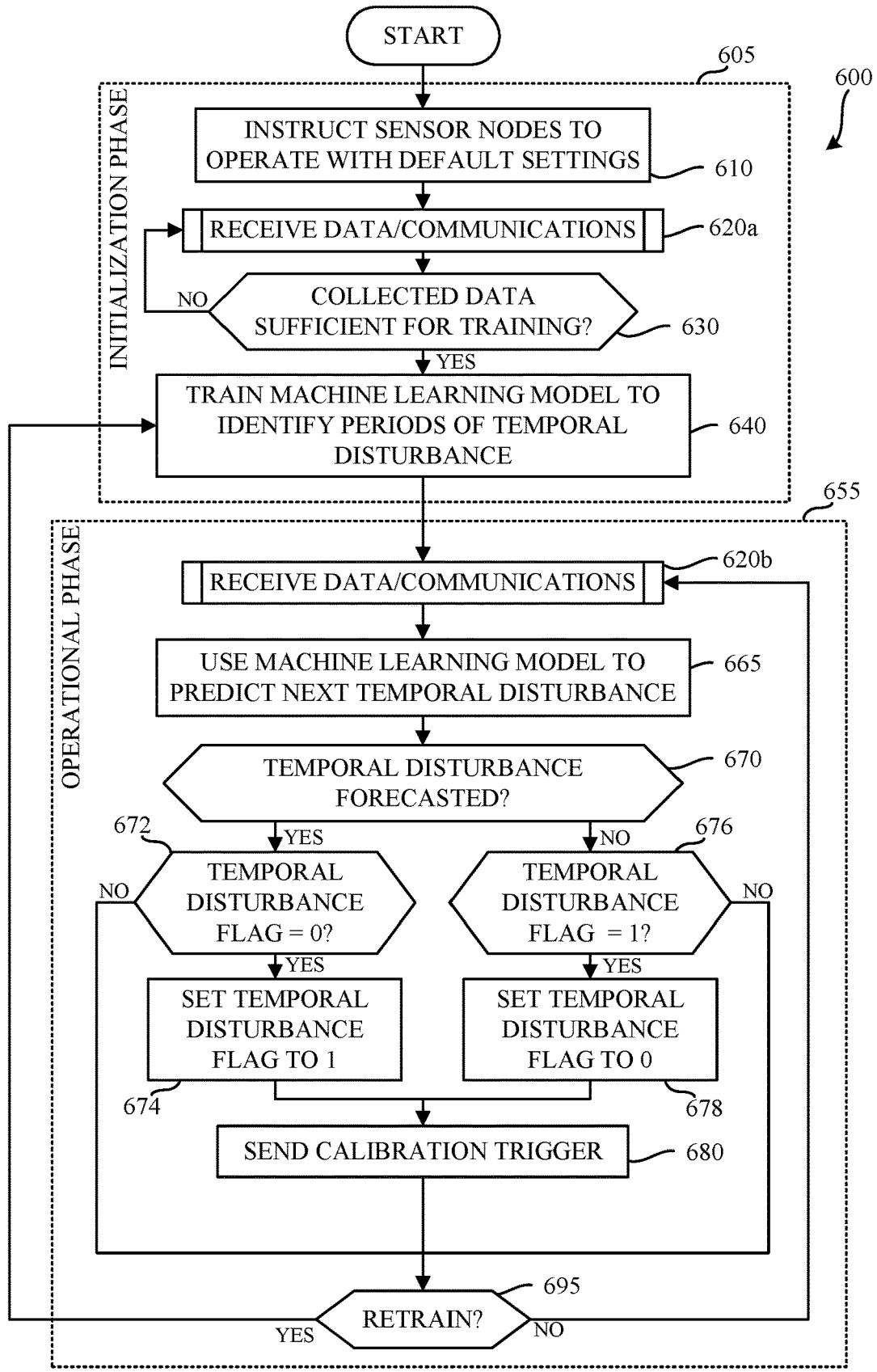
FIG. 6 is a flowchart representative of machine readable instructions which may be executed to implement the example sensor node gateway of FIGS. 1 and/or 3 to determine when to trigger sensor node calibration.

Flowcharts representative of example hardware logic, machine readable instructions, hardware implemented state machines, and/or any combination thereof for implementing the sensor node 120 of FIGS. 1 and/or 4 are shown in FIGS. 5 and/or 7. Flowcharts representative of example hardware logic, machine readable instructions, hardware implemented state machines, and/or any combination thereof for implementing the sensor node gateway 110 of FIGS. 1 and/or 3 are shown in FIGS. 6 and/or 9. The machine readable instructions may be an executable program or portion of an executable program for execution by a computer processor such as the processor 1012 shown in the example processor platform 1000 discussed below in connection with FIG. 10 or the processor 1112 shown in the example processor platform 1100 discussed below in connection with FIG. 11. The program may be embodied in software stored on a non-transitory computer readable storage medium such as a CD-ROM, a floppy disk, a hard drive, a DVD, a Blu-ray disk, or a memory associated with the processor 1012, 1112, but the entire program and/or parts thereof could alternatively be executed by a device other than the processor 1012, 1112 and/or embodied in firmware or dedicated hardware. Further, although the example program is described with reference to the flowchart illustrated in FIGS. 5, 6, 7, and/or 9, many other methods of implementing the example sensor node gateway 110 and/or the example sensor node 120 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIGS. 5, 6, 7, and/or 9 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

FIG. 5 is a flowchart representative of machine readable instructions which may be executed to implement the example sensor node 120 of FIGS. 1 and/or 4 to collect and report sensor data. The example process 500 of FIG. 5 begins when the example data controller 410 determines that the sensor node 120 should wake from a low power mode. (Block 510). In examples disclosed herein, the data controller 410 determines that the device should be woken from the low power mode periodically (e.g., every ten minutes, every hour, etc.) However, the example data controller 410 may determine that the sensor node 120 should be woken from the low power mode in any other fashion. For example, the data controller 410 may determine that the device should be woken from the low power mode a-periodically (e.g., in response to an external stimulus such as an instruction to wake from the low power mode, a sensor value, etc.). The example data controller 410 determines whether a calibration instruction has been received. (Block 515). In some examples, the calibration instruction may cause the device to wake from the low power mode and/or may be received while in the low power mode. If the calibration instruction has been received (e.g., block 515 returns a result of YES), the example calibrator 470 performs a calibration routine. (Block 520). An example calibration routine is disclosed in further detail in connection with FIG. 7, below.

Upon determination that no calibration instruction has been received (e.g., block 515 returning result of NO), or upon performance of the calibration routine (e.g., block 520), the example data controller 410 consults the example configuration memory 460 to determine a number of times to send data. (Block 525). The example data controller 410 consults the configuration memory 460 to determine a transmit power that is to be used. (Block 530). The example data controller 410 consults the configuration memory 460 to determine an identity of a sensor node gateway 110 to which the data is to be sent. (Block 535). The example data controller 410 initializes the transmit counter 412. (Block 540). In examples disclosed herein, the transmit counter 412 is initialized to zero. However, any other initialization value may additionally or alternatively be used.

The example sensor interface 410 interfaces with the one or more sensors 490 to collect sensor data. (Block 545). The example sensor data is passed to the data controller 410, where the example data controller 410 causes the transceiver 420 to transmit the sensor data to the selected gateway using the identified transmit power. (Block 550). In some examples, instead of immediately transmitting the accessed sensor data, the sensor data may be cached in a memory of the sensor node 120. The example data controller 410 increments the transmit counter 412. (Block 555). The example data controller then determines whether the transmit counter 412 meets or exceeds the number of times to send data. (Block 560).

If the transmit counter 412 does not meet or exceed the number of times to send data (e.g., block 560 returns result of NO), the example processes of blocks 550, 555, and 560 are repeated until the counter meets or exceeds the number of times to send data. In this manner, the example sensor node 120 transmits the sensor data multiple times to the sensor node gateway 110. Transmitting multiple times increases the likelihood that at least one of the multiple transmissions will be properly received at the sensor node gateway 110. In examples disclosed herein, the transmission of the sensor data to the selected sensor node gateway 110 includes a sensor node identifier that identifies the sensor node 120 that is transmitting the sensor data.

If the transmit counter 412 meets or exceeds the number of times to send data (e.g., block 560 returns a result of YES), the example data controller 410 causes the sensor node 120 to enter the low power mode. (Block 565). The example process 500 of the illustrated example of FIG. 5 then terminates. The example process 500 of the illustrated example of FIG. 5 may then be repeated (e.g., periodically and/or a periodically) to cause the sensor node 120 to collect and transmit subsequent sensor data.

FIG. 6 is a flowchart representative of machine readable instructions which may be executed to implement the example sensor node gateway 110 of FIGS. 1 and/or 3 to determine when to trigger sensor node calibration. The example process 600 of FIG. 6 involves two phases: an initialization phase 605 and an operational phase 655. In the initialization phase 605, the sensor node gateway 110 collects data from the sensor nodes, and creates a machine learning model to identify anticipated periods of temporal disturbance. In the operational phase 655, the example sensor node gateway 110 collects data from the sensor nodes and uses the machine learning model to predict a next temporal disturbance. Upon entry to and/or exit from a predicted period of temporal disturbance, the example sensor node gateway 110 sends a calibration trigger to cause the sensor node(s) to re-calibrate their transmission power and number of frames to be transmitted.

The example process 600 of FIG. 6 begins when the example communications processor 320, via the transceiver 310, instructs the sensor nodes to operate with default settings. (Block 610). In some examples, block 610 is omitted, and the sensor nodes operate with the settings stored in their corresponding configuration memories. The example communications processor 320 then receives data and/or other communications from the sensor nodes, and processes the received data and/or communications appropriately. (Block 620*a*). An example approach for processing received data and/or communications is described below in connection with FIG. 9.

The example machine learning model trainer 337 then determines whether the sensor data collected by the communications processor 320 in connection with block 620*a* is sufficient for training of a machine learning model. If the example machine learning model trainer 337 determines that the sensor data collected in connection with block 620*a* is not sufficient for training of the machine learning model (e.g., block 630 returns a result of NO) the example process of blocks 620*a* and 630 is repeated until the example machine learning model trainer 337 determines that the sensor data collected in connection with block 620*a* is sufficient for training of the machine learning model. In examples disclosed herein, the collected data is considered sufficient for training when, for example, at least two weeks of data has been collected. However, any other approach for determining whether the collected data is sufficient for training of a machine learning model may additionally or alternatively be used. For example, the example machine learning model trainer 337 may attempt to train the machine learning model and determine a confidence score of the trained model. The collected data may be deemed insufficient for training when, for example the confidence score does not meet a confidence score threshold.

If the example machine learning model trainer 337 determines that the collected data is sufficient for training the machine learning model (e.g., block 630 returns a result of YES), the example machine learning model trainer 337 trains the machine learning model to identify periods of temporal disturbance in the received sensor data. (Block 640). In examples disclosed herein, training is performed using a stochastic gradient descent process. However, any other approach to training a neural network may additionally or alternatively be used. The example machine learning model trained by the machine learning model trainer 337 is stored in the example machine learning model memory 338.

Upon completion of training of the machine learning model, the example sensor node gateway enters the operational phase 655. In the operational phase 655 the example communications processor 320 receives data and/or other communications from the sensor nodes, and processes the received data and/or communications appropriately. (Block 620*b*). As noted above, an example approach for processing received data and/or communications is described below in connection with FIG. 9.

The example disturbance forecaster 330 utilizes the machine learning model stored in the example machine learning model memory 338 by the example machine learning model trainer 337 to predict whether the wireless sensor network is operating within and/or is about to enter a temporal disturbance period. (Block 665). Predicting whether the wireless sensor network is operating within and/or is about to enter into a temporal disturbance period enables timely calibration triggers to be transmitted to the sensor nodes 120, 122, 124, 126. The example disturbance forecaster 330 determines whether such a disturbance is forecasted. (Block 670).

If the example disturbance forecaster 330 determines that the temporal disturbance is forecasted (e.g., block 670 returns a result of YES), the example disturbance forecaster 330 determines whether the example disturbance flag 345 is set to zero. (Block 672). If the temporal disturbance flag is set to zero, this indicates that the wireless sensor network has just entered the temporal disturbance period, and that calibration of the sensor nodes should be triggered. That is, if the example disturbance forecaster 330 determines that the disturbance flag 345 is set to zero (e.g., block 672 returns a result of YES), the example disturbance forecaster 330 sets the temporal disturbance flag to one (block 674) and transmits, via the transceiver 310, a calibration trigger. (Block 680). If the example disturbance forecaster 330 determines that the disturbance flag 345 is set to one (e.g., block 672 returns a result of NO) (indicating that the calibration trigger for the temporal disturbance period has already been transmitted), control proceeds to block 695.

If the example disturbance forecaster 330 determines that the temporal disturbance is not forecasted (e.g., block 670 returns a result of NO) (indicating that the wireless sensor network is not operating in a period of temporal disturbance), the example disturbance forecaster 330 determines whether the example disturbance flag 345 is set to one. (Block 676). If the temporal disturbance flag is set to one, this indicates that the wireless sensor network has just left the temporal disturbance period, and that calibration of the sensor nodes should be triggered. That is, if the example disturbance forecaster 330 determines that the disturbance flag 345 is set to one (e.g., block 676 returns a result of YES), the example disturbance forecaster 330 sets the temporal disturbance flag to zero (block 678) and transmits, via the transceiver 310, the calibration trigger. (Block 680). If the example disturbance forecaster 330 determines that the disturbance flag 345 is set to zero (e.g., block 672 returns a result of NO) (indicating that the calibration trigger for the period of non-disturbance has already been transmitted), control proceeds to block 695.

At block 695, the example disturbance forecaster 330 determines whether the machine learning model trainer 337 should retrain the machine learning model stored in the example machine learning model memory 338. The determination of whether to retrain may be based on, for example, receiving an unanticipated amount of data from the sensor node(s) 120, 122, 124, 126 (e.g., too much data, too little data, etc.). If the example disturbance forecaster 330 determines that the machine learning model trainer 337 should retrain the machine learning model (e.g., block 695 returns a result of YES) control proceeds to block 640. If the example disturbance forecaster 330 determines that the machine learning model trainer 337 should not re-train the machine learning model (e.g., block 695 returns a result of NO), control proceeds to block 620. The example process 600 of FIG. 6 then continues until, for example, the sensor node gateway 110 is powered off.

Figure 7:
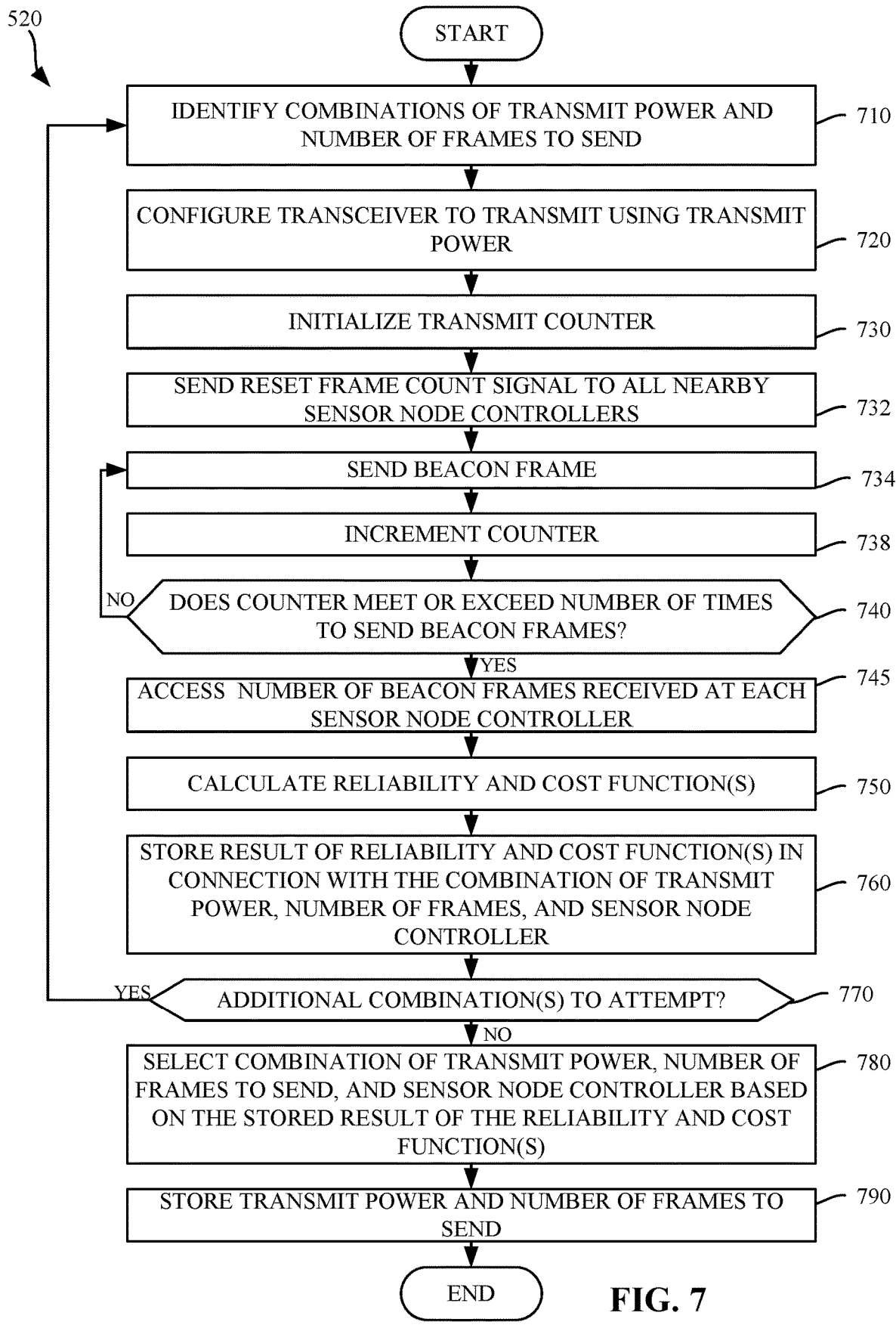
FIG. 7 is a flowchart representative of machine readable instructions which may be executed to implement the example sensor node of FIGS. 1 and/or 4 to perform calibration.

FIG. 7 is a flowchart representative of machine readable instructions which may be executed to implement the example sensor node 120 of FIGS. 1 and/or 4 to perform calibration. The process 520 of the illustrated example of FIG. 7 begins in response to the example data controller 410 determining that a calibration instruction has been received (e.g., block 515 of FIG. 5 returning a result of YES). The example process 520 of FIG. 7 enables the sensor node 120 to select a transmit power, number of redundant frames, and sensor node gateway to be used to transmit sensor data. The trigger for this process is initiated by sensor node gateway 110 when the disturbance forecaster 330 forecasts a start and/or end of a temporal disturbance.

To begin the example process 520, the example calibrator 470 identifies combinations of transmit power and numbers of frames to send. (Block 710). The example calibrator 470 configures the example transceiver 420 to transmit using the transmit power of the identified combination of transmit power and number of frames to send. (Block 720). The example calibrator 470 initializes the example transmit counter 412. (Block 730). The example calibrator 470 causes the example transceiver 420 to transmit a reset frame count signal to all nearby sensor node gateways 110. (Block 732). The example calibrator 470 then causes the transceiver 420 to send a beacon frame to all nearby sensor node gateways 110 using the configured transmit power. (Block 734). In examples disclosed herein, the transmission of the reset frame and subsequent beacon frame is accomplished using a broadcast mechanism. However, in some examples, unicast and/or multicast communications may be used to transmit the reset frame and/or beacon frame to the nearby sensor node gateways. The example calibrator 470 increments the transmit counter 412. (Block 738). The example calibrator 470 then determines whether the value stored in the transmit counter 412 meets or exceeds the number of times to send beacon frames. (Block 740). If the value in the transmit counter 412 does not meet or exceed the number of times to send beacon frames (e.g., block 740 returns a result of NO), the example process of blocks 734, 738, and 740 are repeated until the value in the transmit counter 412 meets or exceeds the number of times to send beacon frames (e.g., until block 740 returns a result of YES).

Upon completion of the transmission of the beacon frames, the example calibrator 470 accesses the number of beacon frames received at each of the nearby sensor node gateways. (Block 745). In examples disclosed herein, the number of beacon frames received at each of the sensor node gateways is retrieved by causing the transceiver 420 to transmit a count request to each of the sensor node gateways, and receiving a response to the count request.

The example calibrator 470 then calculates a reliability of transmitting to each responsive sensor node gateway using the combination of transmit power and number of beacon frames. (Block 750). In examples disclosed herein, the reliability of each combination of sensor node, transmit power, and number of frames is calculated using Equation 1, below.

$$R_{received} = \frac{N_{received}}{N_x} \quad \text{Equation 1}$$

In the example Equation 1, above, $N_{received}$ represents the number of beacon frames received at the sensor node gateway, and $N_x$ represents the total number of beacon frames transmitted to the sensor node gateway. The example calibrator then uses the reliability of receipt ($R_{received}$) to determine a cost function, shown below in connection with Equation 2.

$$C_x = \sqrt{\alpha*(R_{target}-R_{received})^2 + \beta*(P_x*N_x)^2} \quad \text{Equation 2}$$

In Equation 2, $R_{target}$ represents a reliability target (e.g., an expected percentage of beacon frames that should have been received). In examples disclosed herein, the reliability target is ninety percent. However, any other reliability target may additionally or alternatively be used. $P_x$ represents the transmit power used to transmit the beacon frames. $\alpha$ and $\beta$ represent weighting factors.

The example calibrator 470 stores the result of the reliability and cost function(s) in connection with the combination of transmit power, number of frames, and sensor node gateway. (Block 760). In examples disclosed herein, the result(s) are stored in the configuration memory. The example calibrator determines whether there are any additional combinations of transmit power and number of frames to attempt. (Block 770). If additional combinations exist (e.g., block 770 returns a result of YES), the example process of block 710 through 770 are repeated until no additional combinations exist for testing. In some examples, to enable faster calibration, the combination set identified by the example calibrator 470 may be limited to fewer combinations of transmit power and number of frames to send.

Upon determining that no additional combinations exist to attempt (e.g., block 770 returns a result of NO), the example calibrator 470 selects a combination of transmit power, number of frames to send, and sensor node gateway identity based on the stored result(s) of the cost function. (Block 780). In examples disclosed herein, the calibrator selects a combination that meets or exceeds the target reliability, and has a lowest cost. However, any other approach to selecting a combination may additionally or alternatively be used.

The example calibrator 470 then stores the selected transmit power, number of frames to send, and sensor node gateway identity in the configuration memory 460. (Block 790). As a result, the data controller 410, subsequently causes the sensor node to operate using the transmit power, number of frames to send, and sensor node gateway to transmit to based on the information stored by the calibrator 470 in the configuration memory 460. The example process 520 of FIG. 7 then terminates, but may be repeated upon the example data controller 410 determining that a calibration instruction has been received.

Figure 8:
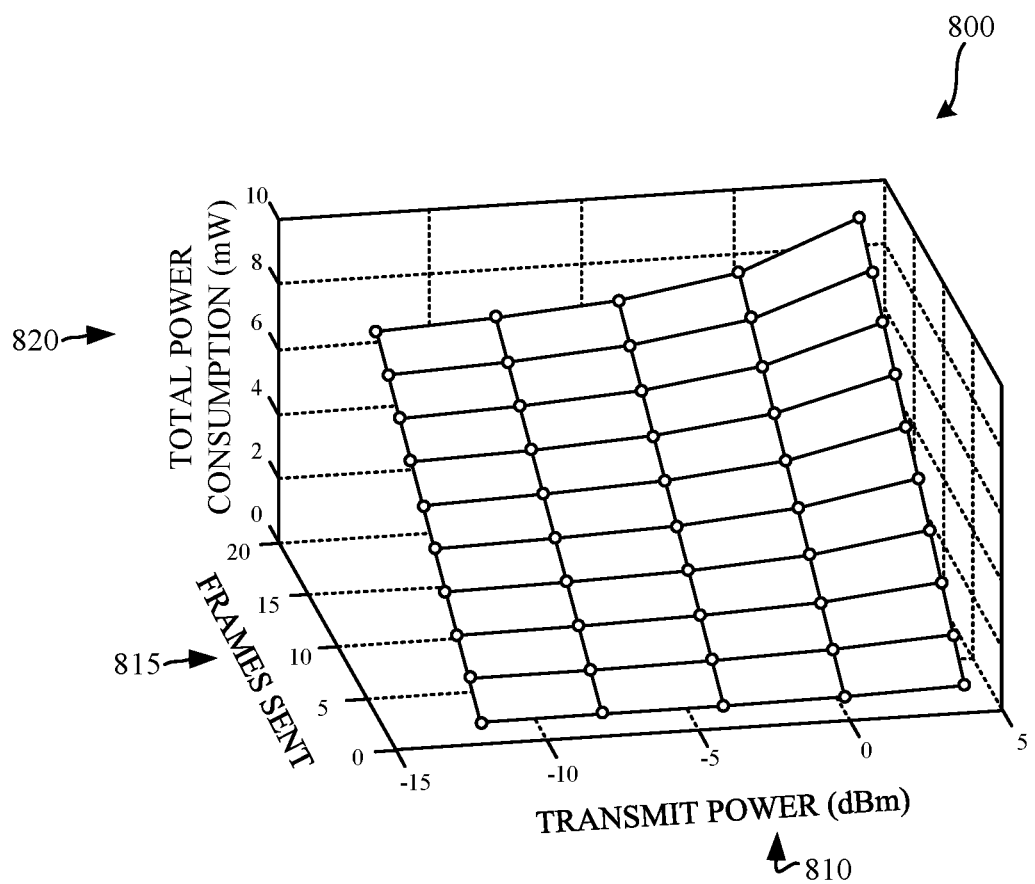
FIG. 8 is a diagram illustrating example total power consumption of a sensor node based on a number of frames sent and a transmit power for those frames.

FIG. 8 is a diagram 800 illustrating example total power consumption of a sensor node based on a number of frames sent and a transmit power for those frames. A first axis 810 represents the transmit power used to transmit a frame (in dBm). A second axis 815 represents a number of frames sent by the sensor node. A third axis 820 represents a total power consumption (in milliwatts) of the sensor node when transmitting the corresponding number of frames and at the corresponding transmit power. If, for example, the battery 450 were implemented using a CR2032 battery, the sensor node would only be able to transmit at a four dBm transmit power transmitting fifteen frames for approximately one hundred and thirty six hours (if transmitting non-stop). As shown in the example diagram 800 of FIG. 8, transmitting additional frames, using higher transmit power, and/or combinations thereof, results in higher overall power consumption.

Figure 9:
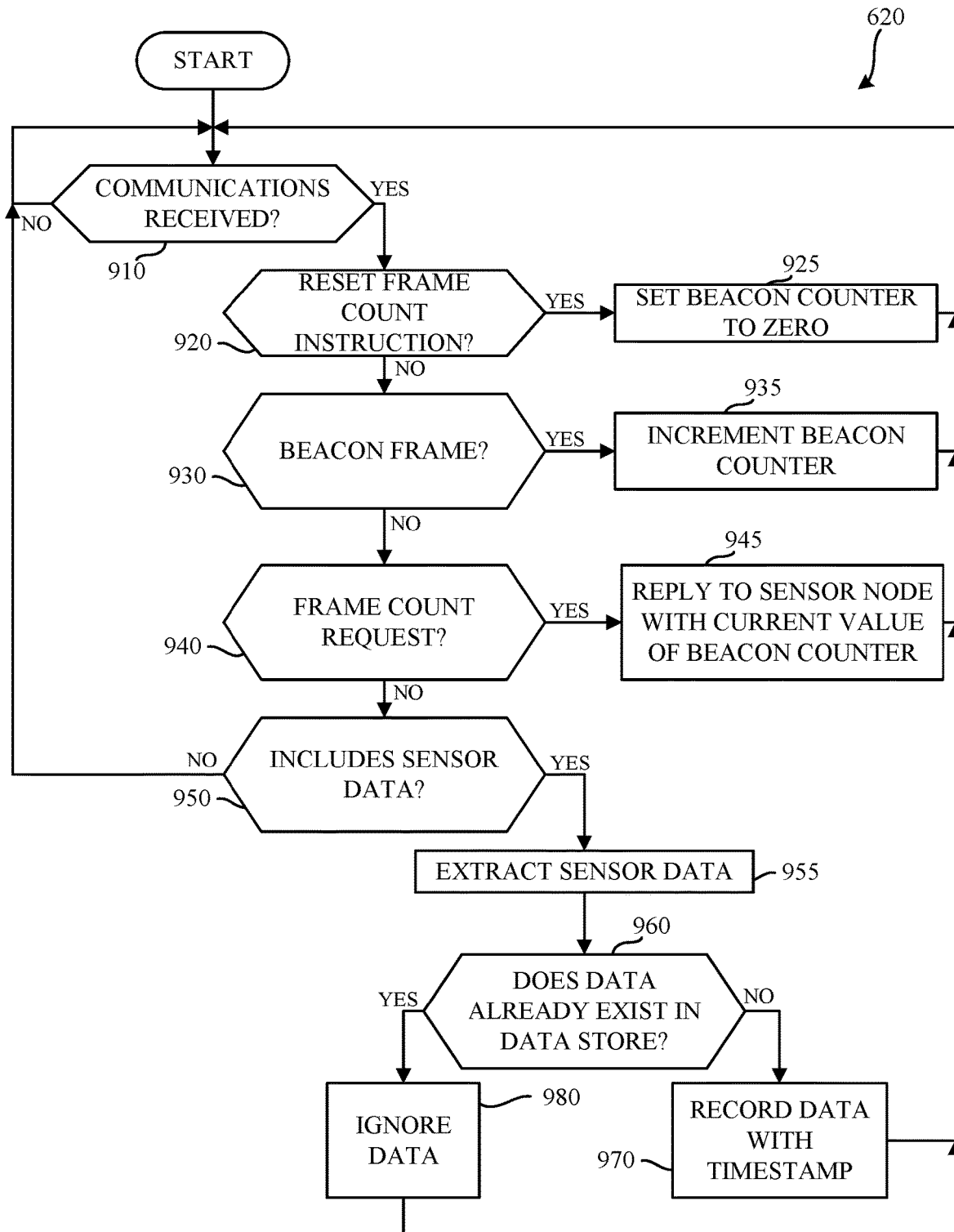
FIG. 9 is a flowchart representative of machine readable instructions which may be executed to implement the example sensor node gateway of FIGS. 1 and/or 3 to determine when process incoming data from the sensor node(s).

FIG. 9 is a flowchart representative of machine readable instructions which may be executed to implement the example sensor node gateway 110 of FIGS. 1 and/or 3 to process incoming data from the sensor node(s) 120, 122, 124, 126. The example process 620 of the illustrated example of FIG. 9 begins when the example communication processor receives a communication via the transceiver 310. (Block 910).

In response to receipt of the communication (e.g., block 910 returning a result of yes, the example communications processor 320 determines whether the received communication is a reset frame count instruction. (Block 920). If the received communication is a reset frame count instruction, the example communications processor 320 sets a value of the beacon counter 340 to zero. (Block 925). In some examples, the beacon counter 340 is associated with a particular sensor node identifier. Associating the beacon counter 340 with a particular sensor node identifier enables the example sensor node gateway 110 to maintain beacon counts in connection with each of the sensor nodes 120, 122, 124, 126 that communicate with the sensor node gateway 110. Control then returns to block 910 where the example communications processor 320 awaits a subsequent communication.

If the example communications processor 320 determines that the received communication is not a reset frame count instruction (e.g., block 920 returns a result of NO), the example communications processor 320 determines whether the received communications is a beacon frame. (Block 930). If the example communications processor 320 determines that the received communication is a beacon frame (e.g., block 930 returns a result of YES), the example communications processor 320 increments the beacon counter 340. (Block 935). Control then returns to block 910 where the example communications processor 320 awaits a subsequent communication.

If the example communications processor 320 determines that the received communication is not a beacon frame (e.g., block 930 returns a result of NO), the example communications processor 320 determines whether the received communication is a frame count request. (Block 940). If the example communications processor 320 determines that the received communication is the frame count request (e.g., block 940 returns a result of YES), the example communications processor 320 causes the example transceiver 310 to reply to the sensor node the transmitted frame count request with the current value of the beacon counter 340. (Block 945). Control then returns to block 910 where the example communications processor 320 awaits a subsequent communication.

If the example communications processor 320 determines that the received communication is not a frame count request (e.g., block 940 returns a result of NO), the example communications processor determines whether the received communication includes sensor data (e.g., sensor values reported by a sensor node). (Block 950). If the example communications processor 320 determines that the received communication does not include sensor data (e.g., block 950 returns a result of NO), control returns to block 910 where the example communications processor 320 awaits a subsequent communication.

If the example communications processor determines that the received communication includes sensor data (e.g., block 950 returns a result of YES), the example communications processor 320 extracts the sensor data from the received communications. (Block 955). The example communications processor 320 consults the aggregated data store 350 to determine if the extracted sensor data is already stored in the example aggregated sensor data store 350. (Block 960). The example communications processor 320 determines whether the extracted sensor data is already stored in the example aggregated sensor data store 350 by querying the aggregated sensor data store 350 to determine whether any data is stored in the aggregated sensor data store 350 in connection with the sensor node that transmitted the communication within a threshold period of time (e.g., the past minute the past 10 seconds, etc.) The example threshold period of time may correspond to the frequency at which the sensor node is expected to wake from the low power mode to transmit sensor data.

If the example communications processor determines that the sensor data does not already exist in the aggregated sensor data store (e.g., block 960 returns a result of NO), the example communications processor records the extracted sensor data in the aggregated sensor data store with a timestamp and an identifier of the sensor node that transmitted the sensor data. (Block 970). Control then returns to block 910 where the example communications processor 320 awaits a subsequent communication.

Returning to block 960, if the example communications processor 320 determines that the sensor data already exists in the aggregated sensor data store (e.g., block 960 returns a result of YES), the example communications processor ignores the data. (Block 980). Ignoring the received data (e.g., not recording the received data in the aggregated sensor data store 350) enables the communications processor 320 to reduce the amount of data stored in the aggregated sensor data store 350, thereby reducing computing resource requirements associated with storing received data. Moreover, because the example sensor node 120, when transmitting data to the sensor node gateway 110, transmits the same data multiple times (e.g., to ensure that at least one of the transmissions is successful), ignoring the received data that has already been recorded ensures that duplicate data is not stored in the example aggregated sensor data store. Control then returns to block 910 where the example communications processor 320 awaits a subsequent communication.

Figure 10:
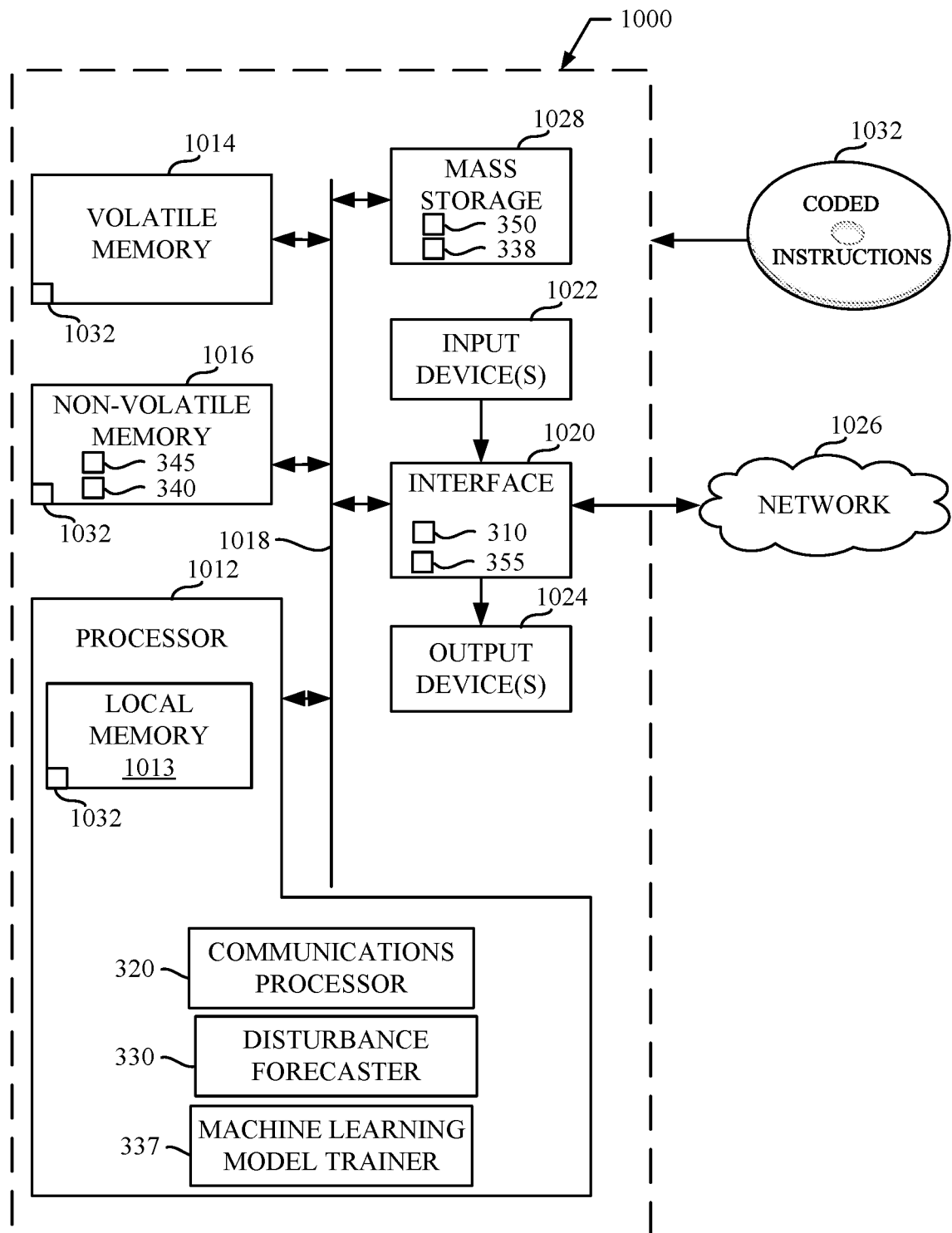
FIG. 10 is a block diagram of an example processing platform structured to execute the instructions of FIGS. 6 and/or 9 to implement the example sensor node gateway of FIGS. 1 and/or 3.

FIG. 10 is a block diagram of an example processor platform 1000 structured to execute the instructions of FIGS. 6 and/or 9 to implement the example sensor node gateway 110 of FIGS. 1 and/or 3. The processor platform 1000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1000 of the illustrated example includes a processor 1012. The processor 1012 of the illustrated example is hardware. For example, the processor 1012 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example communications processor 320, the example disturbance forecaster, and the example machine learning model trainer 337.

The processor 1012 of the illustrated example includes a local memory 1013 (e.g., a cache). The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1016 may be implemented by flash memory and/or any other desired type of memory device. Access to the main memory 1014, 1016 is controlled by a memory controller. In the illustrated example of FIG. 10, the example non-volatile memory 1016 implements the example beacon counter 340 and the example disturbance flag 345.

The processor platform 1000 of the illustrated example also includes an interface circuit 1020. The interface circuit 1020 may be implemented by any type of interface standard, such as an Ethernet interface, a universal serial bus (USB), a Bluetooth® interface, a near field communication (NFC) interface, and/or a PCI express interface. In the illustrated example of FIG. 10, the interface circuit 1020 implements the example transceiver 310 and the example data reporter 355.

In the illustrated example, one or more input devices 1022 are connected to the interface circuit 1020. The input device(s) 1022 permit(s) a user to enter data and/or commands into the processor 1012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1020 of the illustrated example, thus, typically includes a graphics driver card, a graphics driver chip and/or a graphics driver processor.

The interface circuit 1020 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1026. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, redundant array of independent disks (RAID) systems, and digital versatile disk (DVD) drives.

The machine executable instructions 1032 of FIGS. 6 and/or 9 may be stored in the mass storage device 1028, in the volatile memory 1014, in the non-volatile memory 1016, and/or on a removable non-transitory computer readable storage medium such as a CD or DVD. The example mass storage device 1028 of the illustrated example of FIG. 10 implements the example aggregated sensor data store 350 and the example machine learning model memory 338.

Figure 11:
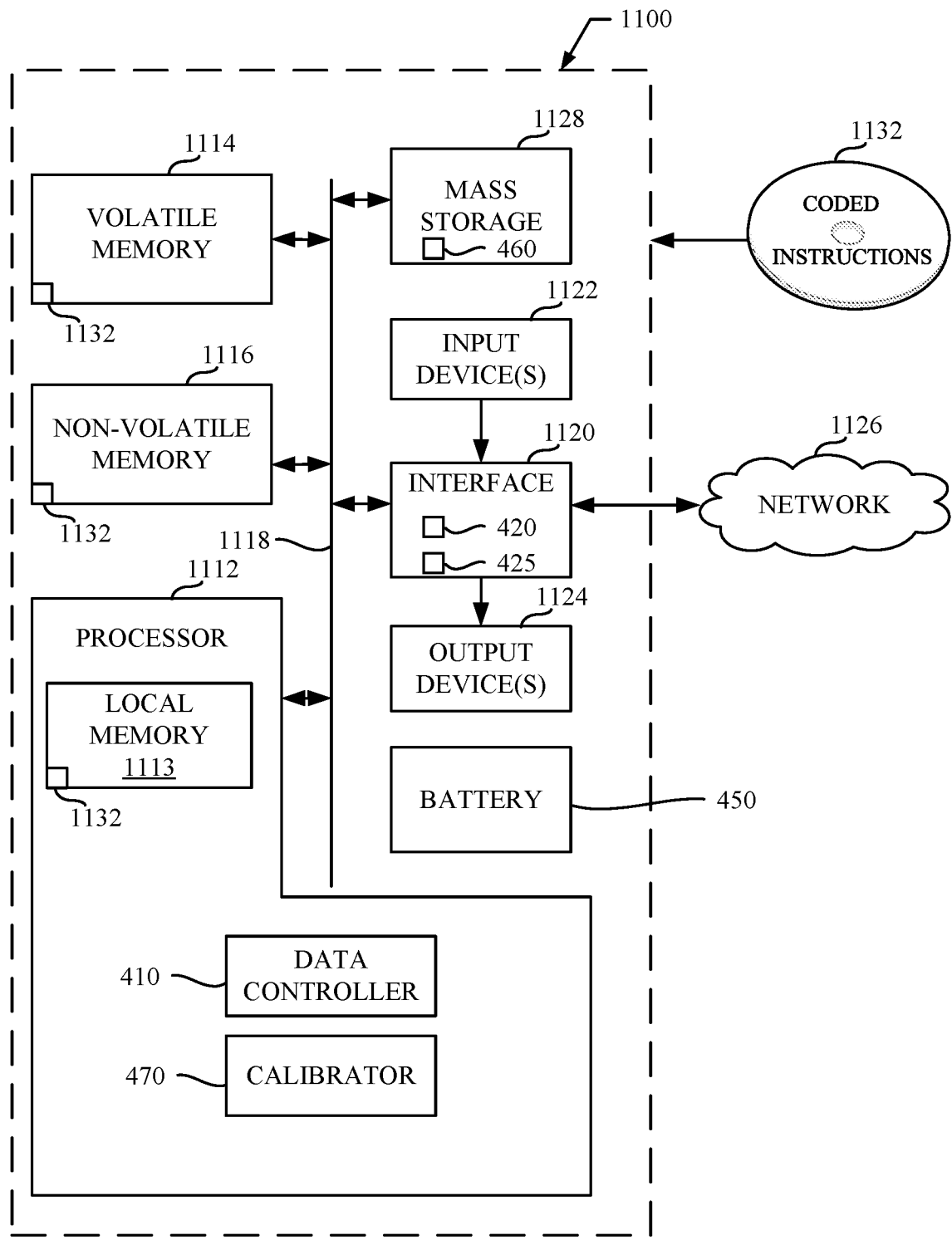
FIG. 11 is a block diagram of an example processing platform structured to execute the instructions of FIGS. 5 and/or 7 to implement the example sensor node of FIGS. 1 and/or 4.

FIG. 11 is a block diagram of an example processor platform 1100 structured to execute the instructions of FIGS. 5 and/or 7 to implement the example sensor node 120 of FIGS. 1 and/or 4. The processor platform 1100 can be, for example, a server, a personal computer, a workstation, a self-learning machine (e.g., a neural network), a mobile device (e.g., a cell phone, a smart phone, a tablet such as an iPad'), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1100 of the illustrated example includes a processor 1112. The processor 1112 of the illustrated example is hardware. For example, the processor 1112 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example data controller 410 and the example calibrator 470.

The processor 1112 of the illustrated example includes a local memory 1113 (e.g., a cache). The processor 1112 of the illustrated example is in communication with a main memory including a volatile memory 1114 and a non-volatile memory 1116 via a bus 1118. The volatile memory 1114 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1116 may be implemented by flash memory and/or any other desired type of memory device. Access to the main memory 1114, 1116 is controlled by a memory controller.

The processor platform 1100 of the illustrated example also includes an interface circuit 1120. The interface circuit 1120 may be implemented by any type of interface standard, such as an Ethernet interface, a universal serial bus (USB), a Bluetooth® interface, a near field communication (NFC) interface, and/or a PCI express interface.

In the illustrated example, one or more input devices 1122 are connected to the interface circuit 1120. The input device(s) 1122 permit(s) a user to enter data and/or commands into the processor 1112. The input device(s) can be implemented by, for example, an audio sensor, a microphone, a camera (still or video), a keyboard, a button, a mouse, a touchscreen, a track-pad, a trackball, isopoint and/or a voice recognition system. In the illustrated example of FIG. 11, the example interface 1120 implements the example transceiver 420 and the example sensor interface 425.

One or more output devices 1124 are also connected to the interface circuit 1120 of the illustrated example. The output devices 1124 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1120 of the illustrated example, thus, typically includes a graphics driver card, a graphics driver chip and/or a graphics driver processor.

The interface circuit 1120 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1126. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1100 of the illustrated example also includes one or more mass storage devices 1128 for storing software and/or data. Examples of such mass storage devices 1128 include floppy disk drives, hard drive disks, compact disk drives, Blu-ray disk drives, redundant array of independent disks (RAID) systems, and digital versatile disk (DVD) drives.

The machine executable instructions 1132 of FIGS. 5 and/or 7 may be stored in the mass storage device 1128, in the volatile memory 1114, in the non-volatile memory 1116, and/or on a removable non-transitory computer readable storage medium such as a CD or DVD. The example mass storage device 1128 of the illustrated example of FIG. 11 implements the example configuration memory 460.

From the foregoing, it will be appreciated that example methods, apparatus and articles of manufacture have been disclosed that enable triggering of sensor node calibration based on a machine learning model. Using a machine learning model enables prediction of whether a period of temporal disturbance is about to be entered or exited, thereby enabling triggering of the calibration of sensor nodes in a wireless sensor network. The disclosed methods, apparatus and articles of manufacture improve the efficiency of using a computing device by dynamically setting transmission configuration(s) of sensor nodes to reduce power requirements. The disclosed methods, apparatus and articles of manufacture are accordingly directed to one or more improvement(s) in the functioning of a computer.

Example 1 includes an apparatus to trigger calibration of sensor nodes, the apparatus comprising a machine learning model trainer to train a machine learning model using first sensor data collected from a sensor node, a disturbance forecaster to, using the machine learning model and second sensor data, forecast a next temporal disturbance to a communication ability of the sensor node, and a communications processor to transmit a first calibration trigger in response to a determination that a start of the temporal disturbance is forecasted and a determination that a first calibration trigger has not been sent, the communications processor to transmit a second calibration trigger in response to determining that an end of the temporal disturbance is forecasted and a determination that a second calibration trigger has not been sent.

Example 2 includes the apparatus of example 1, wherein the machine learning model trainer is further to determine that the first sensor data is sufficient for training the machine learning model, and perform the training of the machine learning model in response to determining that the first sensor data is sufficient.

Example 3 includes the apparatus of example 1, wherein the machine learning model trainer is further to re-train the machine learning model using the second sensor data.

Example 4 includes the apparatus of example 1, wherein the communications processor is further to, in response to receipt of a communication from the sensor node, extract the second sensor data from the communication, determine whether the second sensor data is already stored in a data store, and in response to determining that the second sensor data is already stored in the data stored, not store the second sensor data in the data store.

Example 5 includes the apparatus of example 1, further including a beacon counter, and the communications processor is further to, in response to receipt of a first communication indicating that the sensor node is to begin a calibration sequence, initialize a value of a beacon counter.

Example 6 includes the apparatus of example 5, wherein the communications processor is to, in response to receipt of a second communication, increment the value of the beacon counter.

Example 7 includes the apparatus of example 6, wherein the communications processor is to, in response to receipt of a third communication, transmit the value of the beacon counter to the sensor node.

Example 8 includes at least one non-transitory machine-readable storage medium comprising instructions that, when executed, cause at least one processor to at least train a machine learning model in response to determining that first sensor data collected from a sensor node is sufficient for training the machine learning model, access second sensor data collected from the sensor node, using the machine learning model and the second sensor data to forecast a next temporal disturbance to a communication ability of the sensor node, in response to determining that a start of the temporal disturbance is forecasted and a determination that a first calibration trigger has not been sent, transmit the first calibration trigger, and in response to determining that an end of the temporal disturbance is forecasted and a determination that a second calibration trigger has not been sent, transmit the second calibration trigger.

Example 9 includes the at least one non-transitory machine-readable storage medium of example 8, wherein the instructions, when executed, further cause the at least one processor to determine that the first sensor data is sufficient for training the machine learning model when the first sensor data represents data collected over a threshold amount of time.

Example 10 includes the at least one non-transitory machine-readable storage medium of example 8, wherein the instructions, when executed, further cause the at least one processor to re-train the machine learning model using the second sensor data.

Example 11 includes the at least one non-transitory machine-readable storage medium of example 8, wherein the instructions, when executed, further cause the at least one processor to, in response to receipt of a communication from the sensor node extract the second sensor data from the communication, determine whether the second sensor data is already stored in a data store, and in response to determining that the second sensor data is already stored in the data stored, not store the second sensor data in the data store.

Example 12 includes the at least one non-transitory machine-readable storage medium of example 8, wherein the instructions, when executed, further cause the at least one processor to, in response to receipt of a first communication indicating that the sensor node is to begin a calibration sequence, initialize a value of a beacon counter.

Example 13 includes the at least one non-transitory machine-readable storage medium of example 12, wherein the instructions, when executed, further cause the at least one processor to, in response to receipt of a second communication, increment the value of the beacon counter.

Example 14 includes the at least one non-transitory machine-readable storage medium of example 13, wherein the second communication is a beacon frame.

Example 15 includes the at least one non-transitory machine-readable storage medium of example 13, wherein the instructions, when executed, further cause the at least one processor to, in response to receipt of a third communication, transmit the value of the beacon counter to the sensor node.

Example 16 includes an apparatus to trigger calibration of sensor nodes, the apparatus comprising means for training a machine learning model using first sensor data collected from a sensor node, means for forecasting, using the machine learning model and second sensor data, a next temporal disturbance to a communication ability of the sensor node, and means for transmitting a first calibration trigger in response to a determination that a start of the temporal disturbance is forecasted and a determination that a first calibration trigger has not been sent, transmitting the first calibration trigger, the means for transmitting to transmit a second calibration trigger in response to determining that an end of the temporal disturbance is forecasted and a determination that a second calibration trigger has not been sent, transmitting the second calibration trigger.

Example 17 includes the apparatus of example 16, wherein the means for training is to determine that the first sensor data is sufficient for training the machine learning model, the means for training to perform the training of the machine learning model in response to determining that the first sensor data is sufficient.

Example 18 includes the apparatus of example 16, wherein the means for training is to re-train the machine learning model using the second sensor data.

Example 19 includes the apparatus of example 16, wherein the means for transmitting is further to, in response to receipt of a communication from the sensor node, extract the second sensor data from the communication, determine whether the second sensor data is already stored in a data store, and in response to determining that the second sensor data is already stored in the data stored, not store the second sensor data in the data store.

Example 20 includes a method of triggering calibration of sensor nodes, the method comprising training a machine learning model in response to determining that first sensor data collected from the sensor node is sufficient for training the machine learning model, accessing second sensor data collected from the sensor node, using the machine learning model and the second sensor data to forecast a next temporal disturbance to a communication ability of the sensor node, in response to determining that a start of the temporal disturbance is forecasted and a determination that a first calibration trigger has not been sent, transmitting the first calibration trigger, and in response to determining that an end of the temporal disturbance is forecasted and a determination that a second calibration trigger has not been sent, transmitting the second calibration trigger.

Example 21 includes the method of example 20, further including determining that the first sensor data is sufficient for training the machine learning model when the first sensor data represents data collected over a threshold amount of time.

Example 22 includes the method of example 20, further including re-training the machine learning model using the second sensor data.

Example 23 includes the method of example 20, further including, in response to receipt of a communication from the sensor node extracting the second sensor data from the communication, determining whether the second sensor data is already stored in a data store, and in response to determining that the second sensor data is already stored in the data stored, not storing the second sensor data in the data store.

Example 24 includes the method of example 20, further including, in response to receipt of a first communication indicating that the sensor node is to begin a calibration sequence, initializing a value of a beacon counter.

Example 25 includes the method of example 24, further including, in response to receipt of a second communication, incrementing the value of the beacon counter.

Example 26 includes the method of example 25, wherein the second communication is a beacon frame.

Example 27 includes the method of example 25, further including, in response to receipt of a third communication, transmitting the value of the beacon counter to the sensor node.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. At least one non-transitory machine readable storage medium comprising instructions that cause programmable circuitry to:
   predict, with a machine learning model, a time period when a network node will experience interference from an environment including the network node; and
   cause transmission of a communication to cause the network node to calibrate, the calibration to cause the network node to mitigate the interference by communicating with a first gateway based on the time period.

2. The at least one non-transitory machine readable storage medium of claim 1, wherein the instructions cause the programmable circuitry to predict the time period based on historical data, the historical data indicative of past periods of interference for at least the network node.

3. The at least one non-transitory machine readable storage medium of claim 1, wherein the instructions cause the programmable circuitry to cause transmission of the communication based on a start time of the time period.

4. The at least one non-transitory machine readable storage medium of claim 1, wherein the communication is a first communication to cause the network node to calibrate a first time, and the instructions cause the programmable circuitry to cause transmission of a second communication based on an end time of the time period, the second communication to cause the network node to calibrate a second time.

5. The at least one non-transitory machine readable storage medium of claim 1, wherein the instructions cause the programmable circuitry to:
   increment a counter based on a beacon frame from the network node; and
   cause transmission of a value of the counter to the network node based on a request for a count of beacon frames, the request received from the network node.

6. The at least one non-transitory machine readable storage medium of claim 5, wherein the instructions cause the programmable circuitry to reset the counter based on receipt of a reset frame.

7. The at least one non-transitory machine readable storage medium of claim 1, wherein the instructions cause the programmable circuitry to:

set a flag to indicate that the network node is to experience the interference based on a start time of the time period; and unset the flag to indicate that the network node is not to experience the interference based on an end time of the time period.

8. An apparatus comprising:
communication circuitry;
machine readable instructions; and
programmable circuitry to execute the machine readable instructions to:
based on a calibration trigger associated with a period of expected interference with a communication ability of a network node, cause transmission of beacon frames to a first gateway and a second gateway; and
select one of the first gateway or the second gateway based on at least one of a first reliability of transmission associated with the first gateway, a first cost of transmission associated with the first gateway, a second reliability of transmission associated with the second gateway, or a second cost of transmission associated with the second gateway.

9. The apparatus of claim 8, wherein the programmable circuitry is to:
determine the first reliability of transmission associated with the first gateway based on a first number of the beacon frames transmitted to the first gateway and a second number of the beacon frames received at the first gateway; and
determine the second reliability of transmission associated with the second gateway based on a third number of the beacon frames transmitted to the second gateway and a fourth number of the beacon frames received at the second gateway.

10. The apparatus of claim 9, wherein the programmable circuitry is to:
determine the first cost of transmission based on a first transmission power associated with the transmission of the first number of the beacon frames to the first gateway; and
determine the second cost of transmission based on a second transmission power associated with the transmission of the third number of the beacon frames to the second gateway.

11. The apparatus of claim 8, wherein the programmable circuitry is to:
determine the first cost of transmission associated with the first gateway based on the first reliability of transmission and a target reliability; and
determine the second cost of transmission associated with the second gateway based on the second reliability of transmission and the target reliability.

12. The apparatus of claim 8, wherein the programmable circuitry is to select the first gateway when the first reliability of transmission satisfies a target reliability and the first cost of transmission is lower than the second cost of transmission.

13. The apparatus of claim 8, wherein communication with the one of the first gateway or the second gateway reduces power consumption from a power source of the network node for the period of expected interference.

14. A method comprising:
predicting, with a machine learning model executed at a first gateway, a time period when a network node will experience interference from an environment including the network node;
determining, by executing an instruction with programmable circuitry at the first gateway, that the network node is to calibrate itself to mitigate the interference; and
causing the network node to calibrate itself, the calibration to cause the network node to mitigate the interference by communicating with one of the first gateway or a second gateway for a time interval associated with the time period.

15. The method of claim 14, further including:
transmitting beacon frames to the first gateway and the second gateway; and
selecting one of the first gateway or the second gateway based on at least one of a first reliability of transmission associated with the first gateway, a first cost of transmission associated with the first gateway, a second reliability of transmission associated with the second gateway, or a second cost of transmission associated with the second gateway.

16. The method of claim 15, further including:
determining the first reliability of transmission associated with the first gateway based on a first number of the beacon frames transmitted to the first gateway and a second number of the beacon frames received at the first gateway; and
determining the second reliability of transmission associated with the second gateway based on a third number of the beacon frames transmitted to the second gateway and a fourth number of the beacon frames received at the second gateway.

17. The method of claim 16, further including:
determining the first cost of transmission based on a first transmission power associated with the transmission of the first number of the beacon frames to the first gateway; and
determining the second cost of transmission based on a second transmission power associated with the transmission of the third number of the beacon frames to the second gateway.

18. The method of claim 15, further including:
determining the first cost of transmission associated with the first gateway based on the first reliability of transmission and a target reliability; and
determining the second cost of transmission associated with the second gateway based on the second reliability of transmission and the target reliability.

19. The method of claim 15, further including selecting the first gateway when the first reliability of transmission satisfies a target reliability and the first cost of transmission is lower than the second cost of transmission.

20. The method of claim 15, wherein communication with the one of the first gateway or the second gateway reduces power consumption from a power source of the network node for the time period.

* * * * *